(12) United States Patent
Chen et al.

(10) Patent No.: US 10,271,155 B2
(45) Date of Patent: *Apr. 23, 2019

(54) AUDIO PLAYING SYSTEM

(71) Applicant: GEMTEK TECHNOLOGY CO., LTD., Hsinchu (TW)

(72) Inventors: Hung-Wen Chen, Hsinchu (TW); Chih-Hsu Yen, Hsinchu (TW); Fu-Ming Tien, Hsinchu (TW)

(73) Assignee: GEMTEK TECHNOLOGY CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/725,245

(22) Filed: Oct. 4, 2017

(65) Prior Publication Data

US 2019/0020965 A1 Jan. 17, 2019

(30) Foreign Application Priority Data

Jul. 14, 2017 (TW) .............................. 106210424 U

(51) Int. Cl.
*H03G 5/16* (2006.01)
*H04S 7/00* (2006.01)
*H04S 1/00* (2006.01)
*H04R 5/04* (2006.01)
*H04R 5/02* (2006.01)
*H04R 5/033* (2006.01)

(52) U.S. Cl.
CPC ............. *H04S 7/301* (2013.01); *H03G 5/165* (2013.01); *H04S 1/007* (2013.01); *H04S 7/307* (2013.01); *H04R 5/02* (2013.01); *H04R 5/033* (2013.01); *H04R 5/04* (2013.01)

(58) Field of Classification Search
CPC .......... H04S 7/301; H04S 1/007; H04S 7/307; H03G 5/165; H04R 5/02; H04R 5/033; H04R 5/04
USPC ....................... 381/303, 300, 103, 56, 57, 98
See application file for complete search history.

(56) References Cited

U.S. PATENT DOCUMENTS

| | | | |
|---|---|---|---|
| 4,739,513 A * | 4/1988 | Kunugi .................. | H03G 5/165 381/103 |
| 9,888,334 B1 * | 2/2018 | Chen ...................... | H03G 5/165 |
| 9,930,441 B1 * | 3/2018 | Chen ..................... | H04R 1/1016 |
| 2009/0103742 A1 * | 4/2009 | Ribic ..................... | H04R 25/35 381/60 |

(Continued)

*Primary Examiner* — Vivian C Chin
*Assistant Examiner* — Con P Tran
(74) *Attorney, Agent, or Firm* — Maschoff Brennan

(57) ABSTRACT

An audio playing system has a first channel output device, a first equalizer, and a controller. The first equalizer is configured to adjust a received first channel audio signal with a set of first parameters of frequency response and output the adjusted first channel audio signal to the first channel output device in a first mode, and to adjust the received first channel audio signal with the a of second parameters of frequency response and output the adjusted first channel audio signal to the first channel output device in a second mode. In a test mode, the controller is configured to send a set of test audio signals to the first channel output device and to adjust the set of first parameters of frequency response and the set of second parameters of frequency response based on a plurality of pieces of received first confirmation signal.

15 Claims, 19 Drawing Sheets

(56) References Cited

U.S. PATENT DOCUMENTS

2010/0296668 A1* 11/2010 Lee .................... G10K 11/1784
381/94.7

\* cited by examiner

AUDIO PLAYING SYSTEM

CROSS-REFERENCE TO RELATED APPLICATIONS

This non-provisional application claims priority under 35 U.S.C. § 119(a) on Patent Application No(s). 106210424 filed in Taiwan on Jul. 14, 2017, the entire contents of which are hereby incorporated by reference.

BACKGROUND

Technical Field

The present disclosure is related to an audio playing system, and more particularly to an audio playing system capable of automatically personally compensating.

Related Art

Loudspeakers and earphones are now broadly used in the applications of audio-video field. Ideally, the both channels (left channel and right channel) of the loudspeaker/earphone have the same characteristic. However, due to the limitations of manufacture or materials, the left channel of an earphone and the right channel of the earphone usually have different characteristic. For example, if a piece of audio signal is output by both channels, the left channel may provide higher loudness than the right channel in low-band while the right channel provide higher loudness than the left channel in high-band. Hence, the experience of listening music of the user is influenced.

Further, even if the both channels of an earphone/loudspeaker have identical characteristic, the characteristics of ears of a person may be different. For example, a user of an earphone has his left ear more sensitive to high-band audio signal than his right ear and has his right ear more sensitive to low-band audio signal than his left ear. In this condition, even if the both channels of the earphone have the same characteristic, the user cannot has good audio experience because of the unbalance of ears. Hence, how to provide an audio playing system to optimize the audio experience by measuring the response of the user for the earphone/loudspeaker, and obtaining the characteristic of the earphone/loudspeaker and the user's ears so as to adjust the equalizers to compensate the difference between two channels and the difference between two ears, and to conquer the weakness that the quality of sound is affected, to provide good sound effect to meet the user's expect for high quality of sound are problems to be solved.

SUMMARY

In one embodiment of the present disclosure, an audio playing system has a first channel output device, a first equalizer, and a controller. The first equalizer is electrically coupled to the first channel output device and has a set of first parameters of frequency response and a set of second parameters of frequency response. The first equalizer is configured to adjust a received first channel audio signal with the set of first parameters of frequency response and output the adjusted first channel audio signal to the first channel output device in a first mode, and the first equalizer configured to adjust the received first channel audio signal with the set of second parameters of frequency response and output the adjusted first channel audio signal to the first channel output device in a second mode. The controller is electrically coupled to the first channel output device and the first equalizer, wherein in a test mode, the controller is configured to send a set of test audio signals to the first channel output device, to generate a set of first user parameters based on a plurality of pieces of received first confirmation signal, and to adjust the set of first parameters of frequency response and the set of second parameters of frequency response based on the set of first user parameters, and to control the first equalizer to operate in the first mode or the second mode based on a selection signal.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
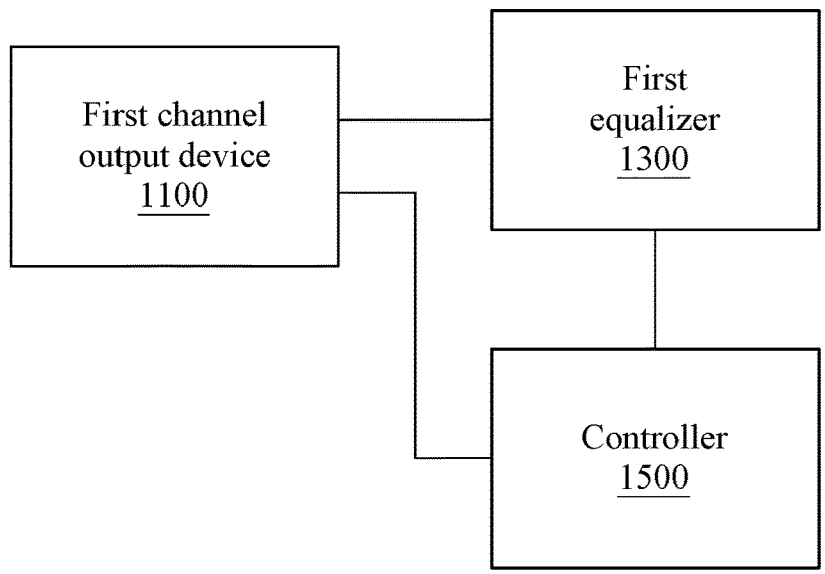
FIG. 1 is a schematic diagram of an audio playing system according to one embodiment of the present disclosure.

Please refer to FIG. 1, which is a schematic diagram of an audio playing system according to one embodiment of the present disclosure. As shown in FIG. 1, the audio playing system 1000 according to one embodiment of the present disclosure has a first channel output device 1100, a first equalizer 1300 and a controller 1500. The first equalizer 1300 is electrically coupled to the first channel output device 1100, and the controller 1500 is electrically coupled to the first channel output device 1100 and the first equalizer 1300. In this disclosure, the audio playing system is, for example, a system for outputting audio signal with earphone, loudspeaker, etc.

Figure 2:
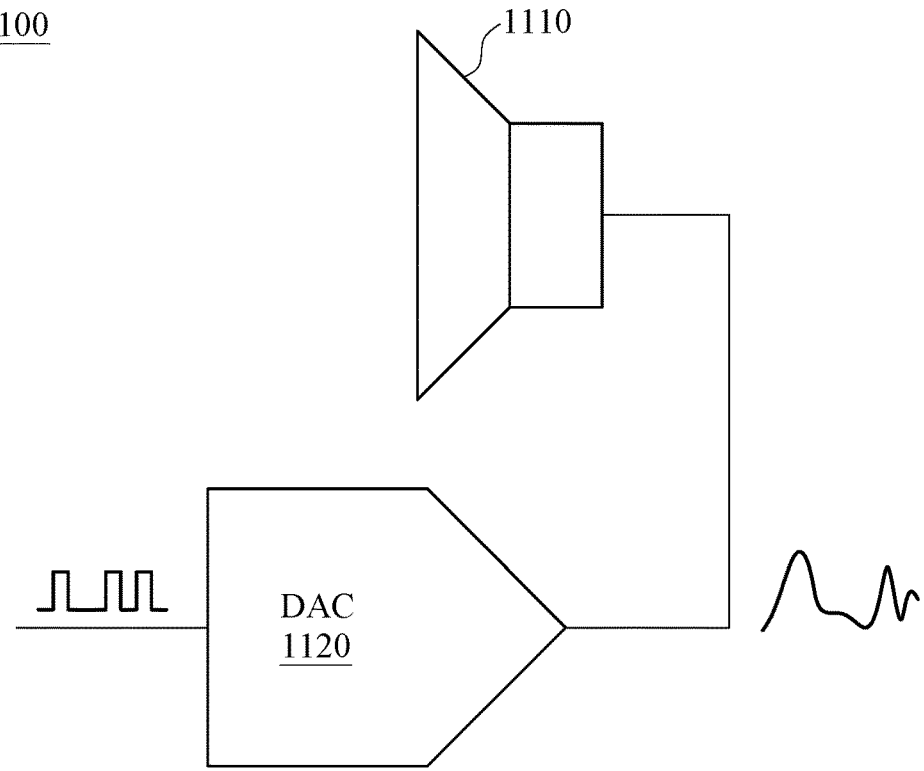
FIG. 2 is a functional block diagram of the first channel output device according to one embodiment of the disclosure.

In one embodiment, the first channel output device 1100 is a simple loudspeaker. When the coil of the loudspeaker is driven by current, the coil makes the vibrating film vibrate to generate sound. In another embodiment, the first channel output device 1100 has the loudspeaker and a digital-to-analog converter (DAC) therein. For explaining the mechanism, please refer to FIG. 2, which is a functional block diagram of the first channel output device according to one embodiment of the disclosure. As shown in FIG. 2, the first channel output device 1100 according to one embodiment of the disclosure has a loudspeaker 1110 and a DAC 1120. The DAC 1120 converts the received digital audio signal into current and the current drives the coil of the loudspeaker 1110 so as to make the vibrating film vibrate and generate sound. In other words, the first channel output device 1100 may be driven by digital audio signal or analog audio signal to generate sound.

The first equalizer 1300 has a set of first parameters of frequency response. When the first equalizer 1300 receives the first channel audio signal, the first equalizer 1300 adjusts the received first channel audio signal with the first parameters of frequency response and outputs the adjusted first channel audio signal to the first channel output device. In one embodiment, the first equalizer 1300 is integrated circuits (IC) with digital signal processing (DSP) ability which can implement the filter with certain frequency response by DSP. Further, what is outputted by the first equalizer 1300 is a segment of the digital signal corresponding to the adjusted first channel audio signal. In this embodiment, the first equalizer 1300 can be used together with the first channel output device 1100 having embedded digital-to-analog converter and loudspeaker therein.

In another embodiment, the first equalizer 1300 has a digital-to-analog converter therein in addition, so what is outputted by the first equalizer 1300 is a segment of analog signal corresponding to the adjusted first channel audio signal. The first equalizer 1300 in this embodiment can be used together with the first channel output device 1100 without the digital-to-analog converter. In another embodiment, the first equalizer 1300 is, for example, an equalizer implemented by software.

For understanding the utilities of the set of first parameters of frequency response, please refer to table I shown below, which illustrate the set of first parameters of frequency response.

TABLE I

| | Frequency (Hz) | | | | | | | |
| --- | --- | --- | --- | --- | --- | --- | --- | --- |
| | 110 | 220 | 440 | 880 | 1760 | 3520 | 7040 | 14080 |
| Gain (dB) | +6 | +6 | 0 | −3 | −3 | −3 | +3 | +3 |

As shown in table I, the set of first parameters of frequency response of the first equalizer 1300 has eight pieces of data, and each piece of data is consisting of a frequency and a gain. That is, the set of first parameters of frequency response defines the frequency response of the first equalizer 1300 by indicating the gains of certain frequencies. In one embodiment, only the gains are adjustable when adjusting the set of first parameters of frequency response. In another embodiment, either the frequencies or the gains are adjustable. For example, the table I may be adjusted as the table II as shown below:

TABLE II

| | Frequency (Hz) | | | | | | | |
| --- | --- | --- | --- | --- | --- | --- | --- | --- |
| | 1000 | 2000 | 3000 | 4000 | 6000 | 8000 | 10000 | 20000 |
| Gain (dB) | +12 | +6 | +3 | +0 | +0 | +0 | +0 | +6 |

In one embodiment, the gain at the frequencies lower than the smallest frequency defined in the set of first parameters of frequency response is equal to the gain at the smallest frequency defined in the set of first parameters of frequency response. The gain at the frequencies higher than the highest frequency defined in the set of first parameters of frequency response is equal to the gain at the highest frequency defined in the set of first parameters of frequency response. Specifically, taking table II for example, the first equalizer 1300 set according to the table II has a gain of +12 decibel (dB) at any frequency lower than 1 kHz and a gain of +6 dB at any frequency higher than 20 kHz. Although the first parameters of frequency response in either the table I or the table II is consisting of eight pieces of data, the number of pieces of data in the first parameters of frequency response is not limited by the disclosure. Further, even there are eight pieces of data predefined in the set of first parameters of frequency response, the controller 1500 is capable of adding or eliminating one or more pieces of data in the set of first parameters of frequency response arbitrarily when the controller 1500 is adjusting the set of first parameters of frequency response. For example, the controller 1500 is capable of defining the set of first parameters of frequency response with only five pieces of data. The controller 1500 is also capable of defining the set of first parameters of frequency response with ten pieces of data.

Figure 3:
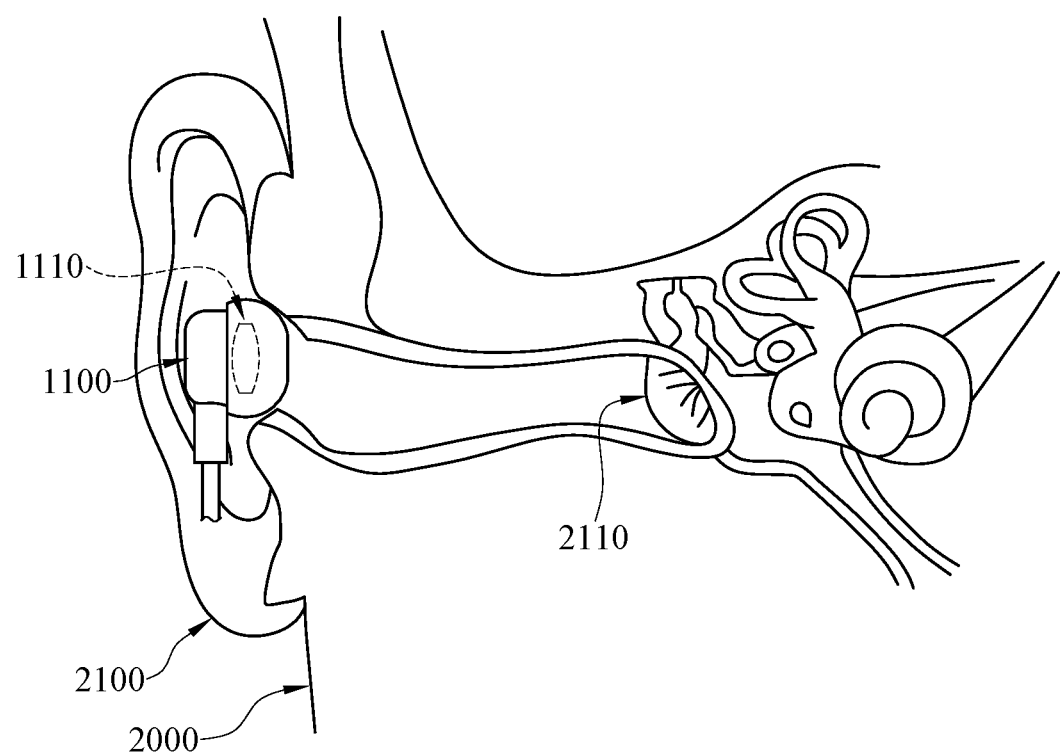
FIG. 3 illustrates an operation diagram of the audio playing system according to one embodiment of the disclosure.

One utility of the controller 1500 is for adjusting the set of first parameters of frequency response of the first equalizer 1300. The controller 1500 is implemented by either an IC or software. In one embodiment, please refer to FIG. 3, which illustrates an operation diagram of the audio playing system according to one embodiment of the disclosure. As shown in FIG. 3, the first channel output device 1100 of the audio playing system 1000 is put in the right ear 2100 of the user 2000, and the right ear 2100 of the user 2000 has an eardrum 2110. The coil and the vibrating film of the loudspeaker 1110 of the first channel output device 1100 has a first sound pressure level response (SPL response) SPL1. What is the sound pressure level response is the distribution of the ratio between the actual loudness and the amplitude of the audio signal at each frequency when the first channel output device 1100 is driven by the audio signal to generate sound. Similarly, the eardrum 2110 of the user 2000 has a second sound pressure level response (SPL response) SPL2 which reflects a frequency response of the sensitivity of hearing of the user 2000.

When the user 2000 is equipped with the audio playing system 1000 according to one embodiment of the disclosure, he may choose to use the audio playing system 1000 in the test mode. In the test mode, the controller 1500 sends a set of test audio signals to the first channel output device 1100. In one embodiment, the test audio signals have, for example, 20 sets of narrow bandwidth audio signals. In one embodiment, the central frequency of the first set of narrow bandwidth audio signals is 500 Hz; the central frequency of the second set of narrow bandwidth audio signals is 1000 Hz; the central frequency of the third set of narrow bandwidth audio signals is 1500 Hz; and the central frequency of the twentieth set of narrow bandwidth audio signals is 10 kHz. In other words, the difference between the central frequencies of the sets of narrow bandwidth audio signals is no less than 500 Hz. Besides, the bandwidth of each set of narrow bandwidth audio signals is, for example, 100 Hz. In one embodiment, each set of narrow bandwidth audio signals has three pieces of narrow bandwidth test audio signal, and the strength of the pieces of narrow bandwidth test audio signal are different from one another. In other words, the loudness of each piece of narrow bandwidth test audio signal when output is different from that of another.

In one embodiment, when the controller 1500 sends the test audio signals to the first channel output device 1100, the controller 1500 sequentially sends the aforementioned twenty sets of narrow bandwidth audio signals, from the first set to the twentieth set, to the first channel output device 1100. In other words, the test is performed from low frequency to high frequency. In another embodiment, when the controller 1500 sends the test audio signals to the first channel output device 1100, the twenty sets of narrow bandwidth audio signals are not sent in sequence from low frequency to high frequency. On the contrary, the controller 1500 at first outputs one set of narrow bandwidth audio signals in the mid-band among the twenty sets of narrow bandwidth audio signals. Said set of narrow bandwidth audio signals in mid-band is, for example, a set of narrow bandwidth audio signals whose central frequency falls between 3 kHz and 7.5 kHz. That is, a set of narrow bandwidth audio signals among the sixth set to the fifteenth set of narrow bandwidth audio signal. Specifically, the controller 1500 is capable of classifying the twenty sets of narrow bandwidth audio signals into three categories. The first category contains sets of narrow bandwidth audio signals in low-band such as sets of narrow bandwidth audio signals whose central frequency is no more than 2.5 kHz. The second category contains sets of narrow bandwidth audio signals in mid-band. The third category contains sets of narrow bandwidth audio signals in high-band such as sets of narrow bandwidth audio signals whose central frequency is no less than 8 kHz. The controller 1500 at first selects one set of narrow bandwidth audio signals from the second category, such as the tenth set of narrow bandwidth audio signals, whose central frequency is 5 kHz, to be sent to the first channel output device 1100. Then, the controller 1500 selects one set of narrow bandwidth audio signals from the first category, such as the first set of narrow bandwidth audio signals, whose central frequency is 500 Hz, to be sent to the first channel output device 1100. In the subsequent procedure in the test mode, the controller 1500 does neither successively output two sets of narrow bandwidth audio signals in the first category nor successively output two sets of narrow bandwidth audio signals in the third category.

In another embodiment, the controller 1500 operates as a finite state machine or other mechanism in the test mode so as to output one or more sets of narrow bandwidth audio signals in the second category during the first period, and then output one or more sets of narrow bandwidth audio signals in the first category during the second period, and then output one or more sets of narrow bandwidth audio signals in the third category during the third period, and repeatedly to perform the test.

Because the hearing of human is more sensitive to the audio signal in the mid-band than in low-band or in high-band, the aforementioned procedure insure that the user would not consider the audio playing system as malfunction just because he misses the test audio signal for a long time.

In the aforementioned embodiment, although the difference between the central frequencies of adjacent two sets of narrow bandwidth audio signals is 500 Hz, that difference may be adjusted as needed and is not necessarily a constant value. For example, in one implementation, the central frequency of the first set of narrow bandwidth audio signals is 100 Hz; the central frequency of the second set of narrow bandwidth audio signals is 200 Hz; the central frequency of the third set of narrow bandwidth audio signals is 400 Hz; the central frequency of the fourth set of narrow bandwidth audio signals is 800 Hz; the central frequency of the fifth set of narrow bandwidth audio signals is 1.6 kHz; the central frequency of the sixth set of narrow bandwidth audio signals is 3.2 kHz; the central frequency of the seventh set of narrow bandwidth audio signals is 6.4 kHz; and the central frequency of the eighth set of narrow bandwidth audio signals is 12.8 kHz. In one embodiment, the central frequency of every set of narrow bandwidth audio signals is between 20 Hz and 20 kHz. However, in other embodiments, the central frequency of each set of narrow bandwidth audio signals may be between 100 Hz and 10 kHz or between 1 kHz and 10 kHz.

In one embodiment, when the controller 1500 outputs a set of narrow bandwidth audio signals, the controller 1500 first outputs the piece of narrow bandwidth test audio signal with least loudness and then outputs the others in sequence of increasing the loudness. Whenever the user 2000 hears the sound output by the audio playing system 1000, the user 2000 input a gesture on an input device signaling with the controller 1500, so the controller 1500 receives a corresponding first confirmation signal. For example, the input device is a remote controller or a touch screen. As illustrated above, the controller 1500 performs the test with the 20 sets of narrow bandwidth audio signals, and generates a set of first user parameters SPLU1 based on a plurality of received first confirmation signals. The controller 1500 adjusts the set of first parameters of frequency response based on the set of first user parameters SPLU1. In the aforementioned examples, though the test audio signals used by the controller 1500 have 20 sets of narrow bandwidth audio signals and each set of narrow bandwidth audio signals has three pieces of narrow bandwidth test audio signal with different loudness, the present disclosure is not to limit the amount. One having ordinary skill in the art may set the test audio signals based on his need.

Figure 4A:
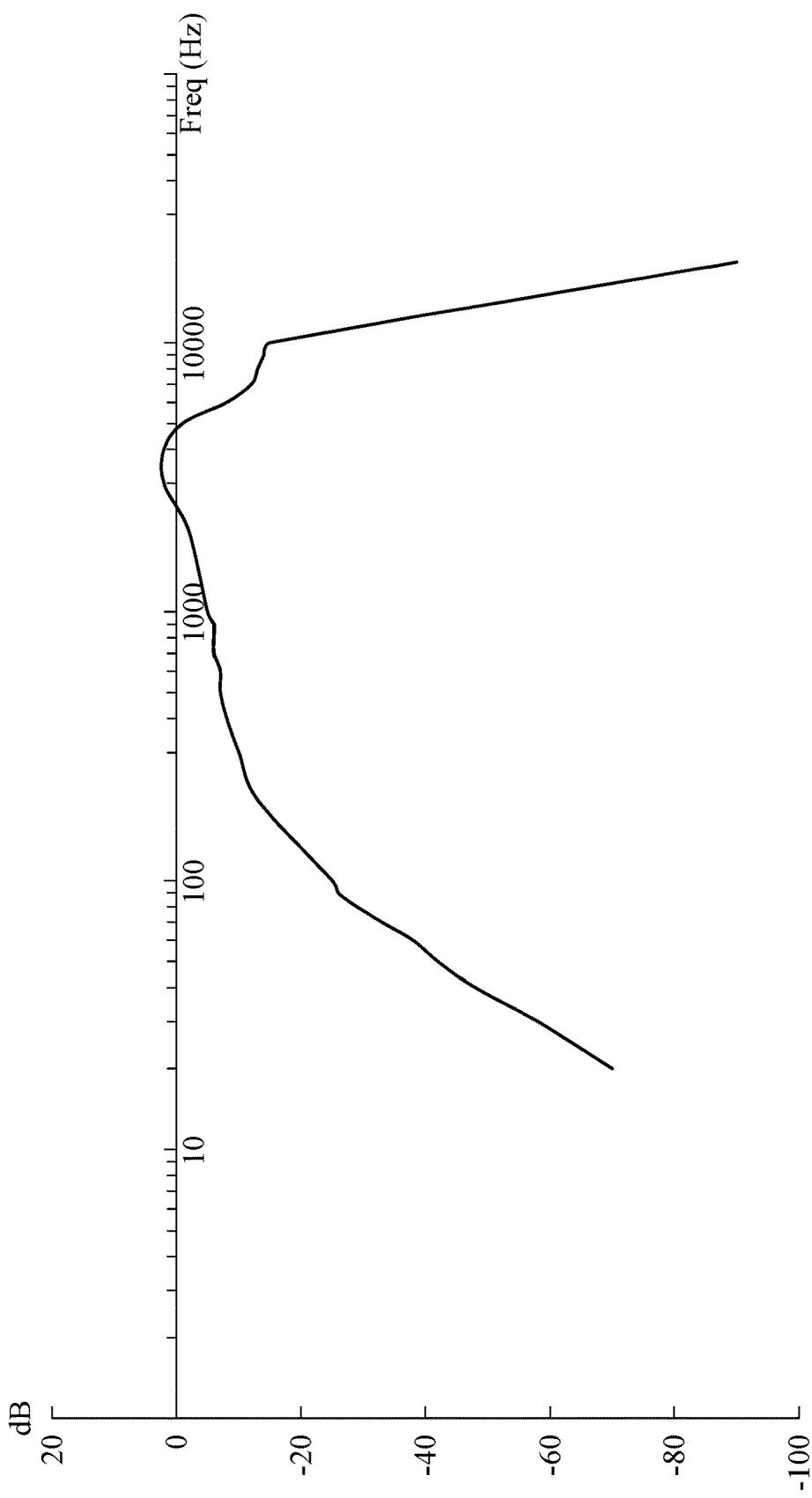
FIG. 4A illustrates the spectrum of sensitivity of hearing of ideal ear of human.
Figure 4B:
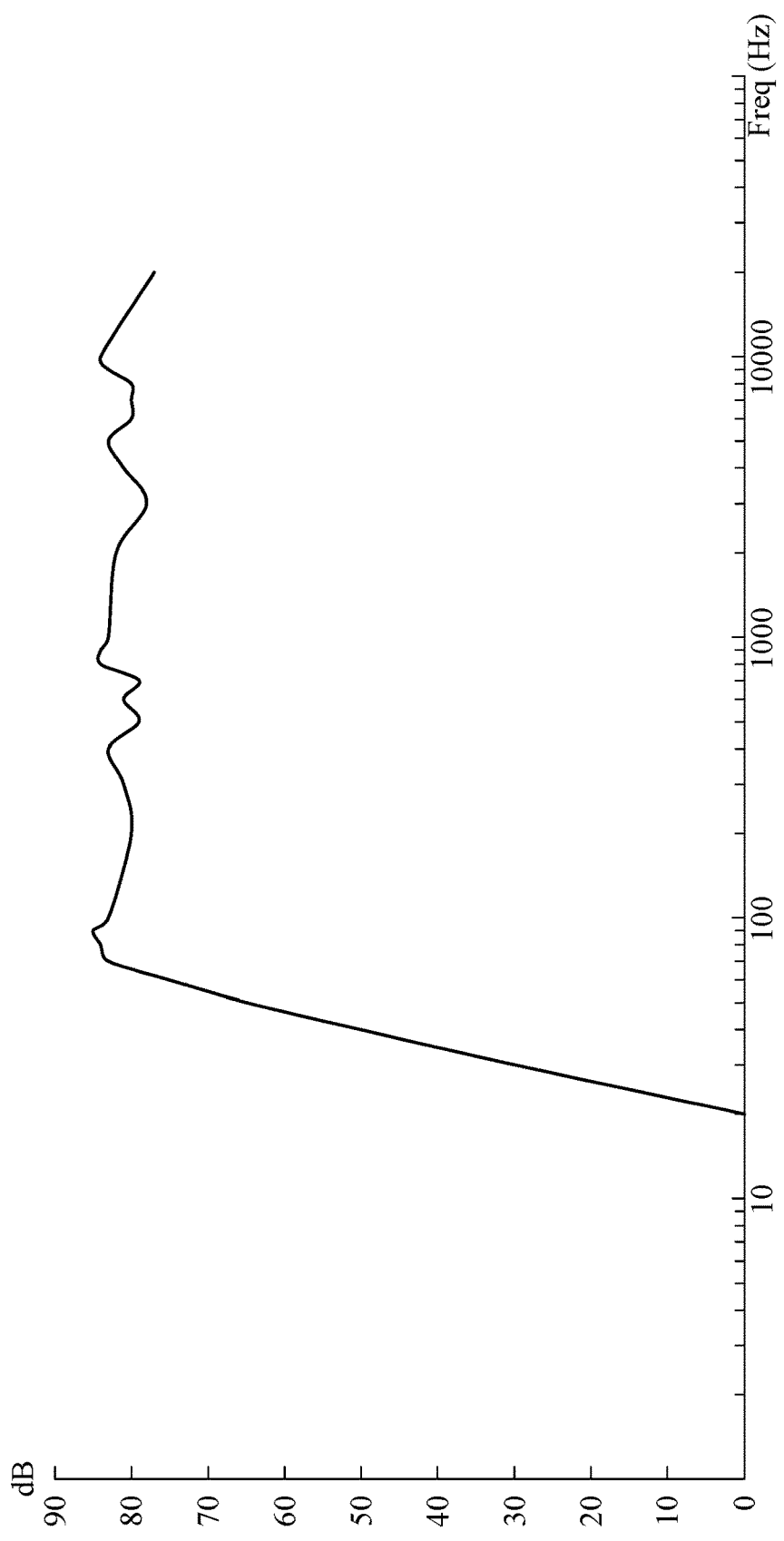
FIG. 4B illustrates a spectrum of sound pressure level response of a channel output device.
Figure 4C:
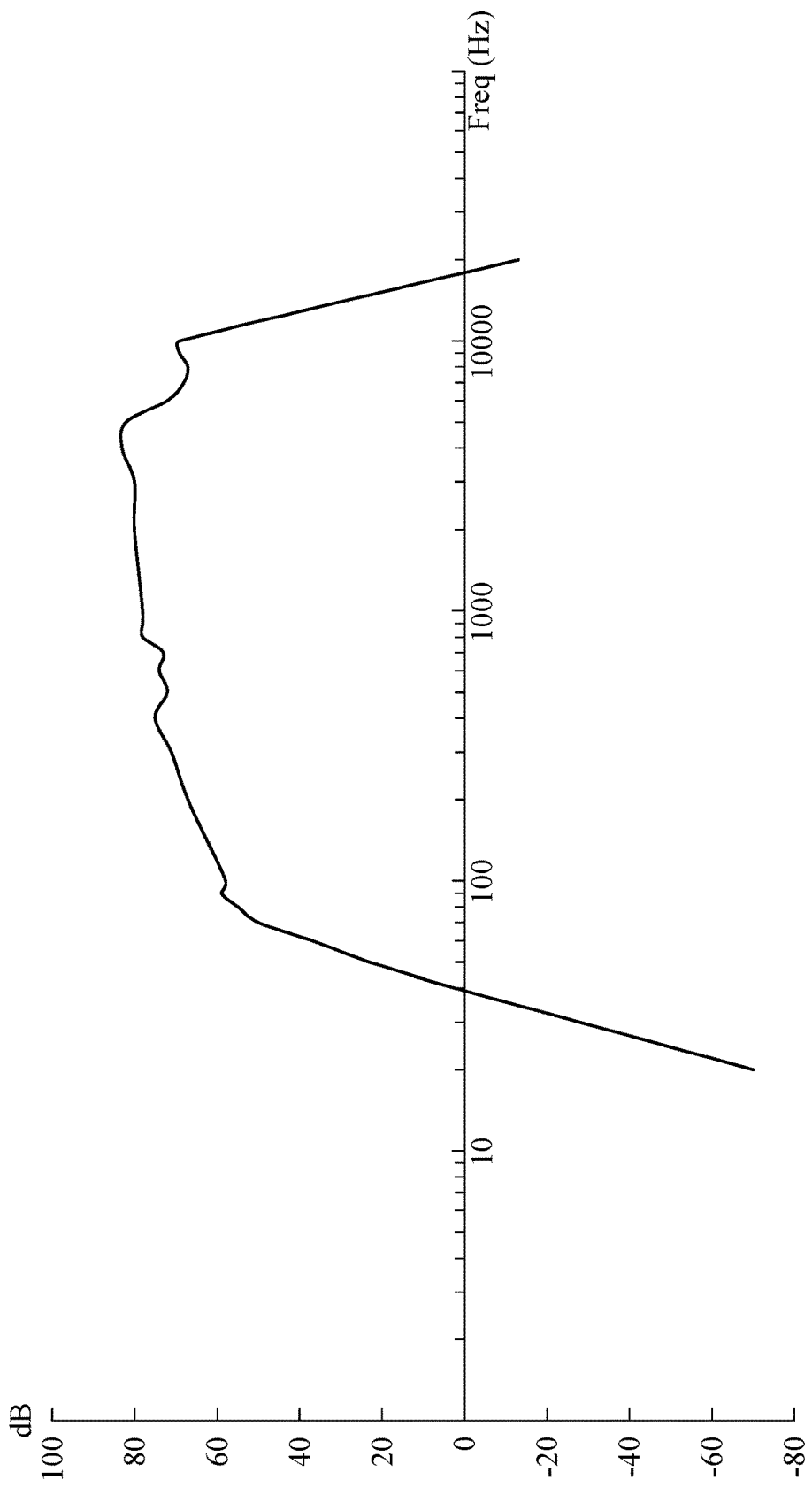
FIG. 4C is a superposition of both of FIG. 4A and FIG. 4B.

For understanding the meaning of the set of first user parameters SPLU1 and the mechanism of adjusting the set of first parameters of frequency response based on the first user parameters SPLU1, please refer to FIG. 4A~FIG. 4C. FIG. 4A illustrates the spectrum of sensitivity of hearing of ideal ear of human, and that is an ideal spectrum of the aforementioned second sound pressure level response SPL2. FIG. 4B illustrates a spectrum of sound pressure level response of a channel output device. For example, FIG. 4B may be obtained by scanning with signal having maximum amplitude. Specifically, if the DAC of one channel output device is capable of driving the loudspeaker with 1 $V_{p-p}$ signal, FIG. 4B is obtained by driving the loudspeaker with 1 $V_{p-p}$ signal at a variety of frequencies and analyzing the loudness of sound output by the loudspeaker. In other words, FIG. 4B may be seen as the spectrum of the aforementioned first sound pressure level response SPL1. FIG. 4C is a superposition of both of FIG. 4A and FIG. 4B, and it illustrates the spectrum of the set of ideal first user parameters SPLU1.

Figure 5A:
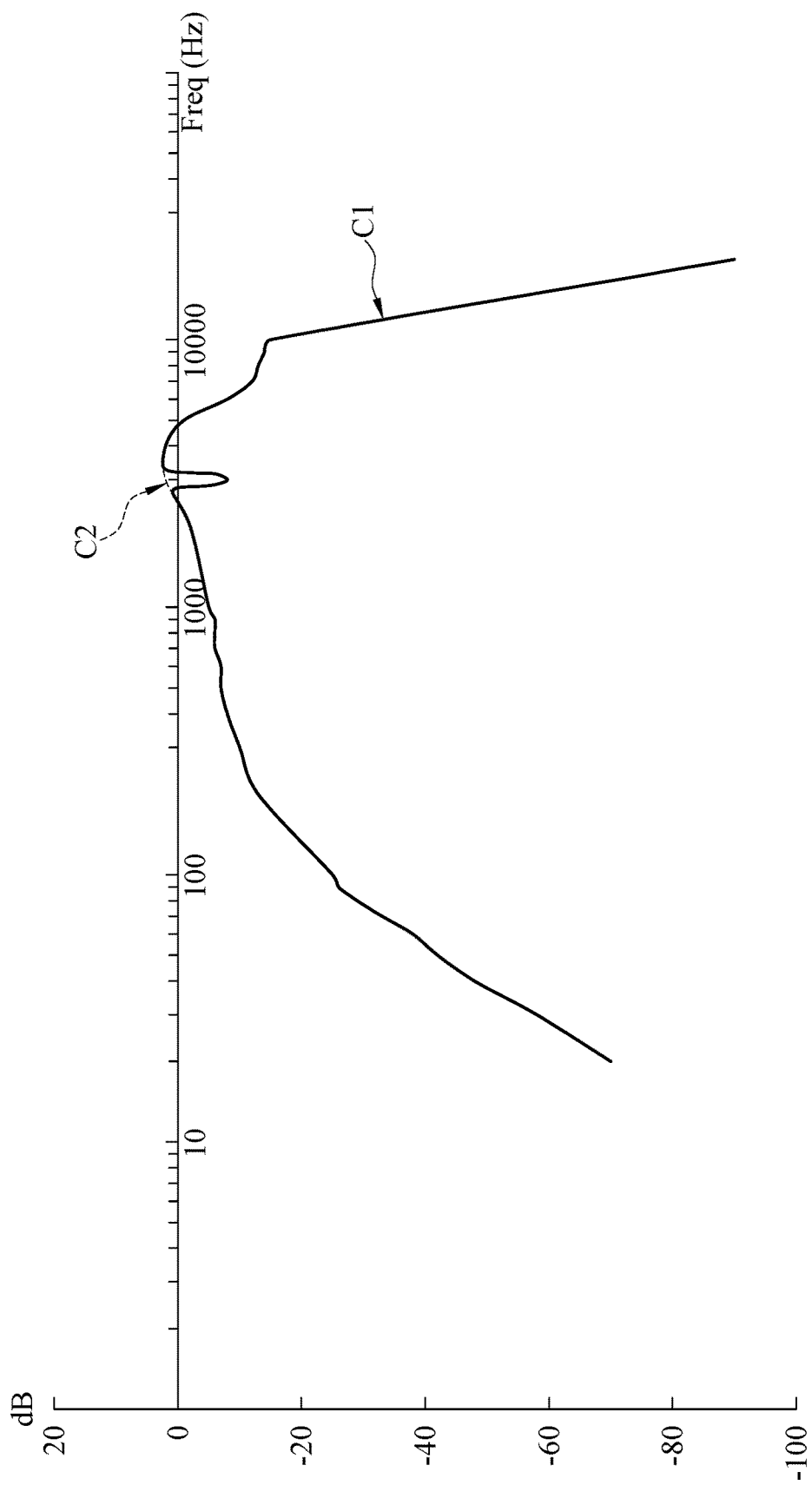
FIG. 5A is a comparison between the real hearing sensitivity of user and the ideal hearing sensitivity.
Figure 5B:
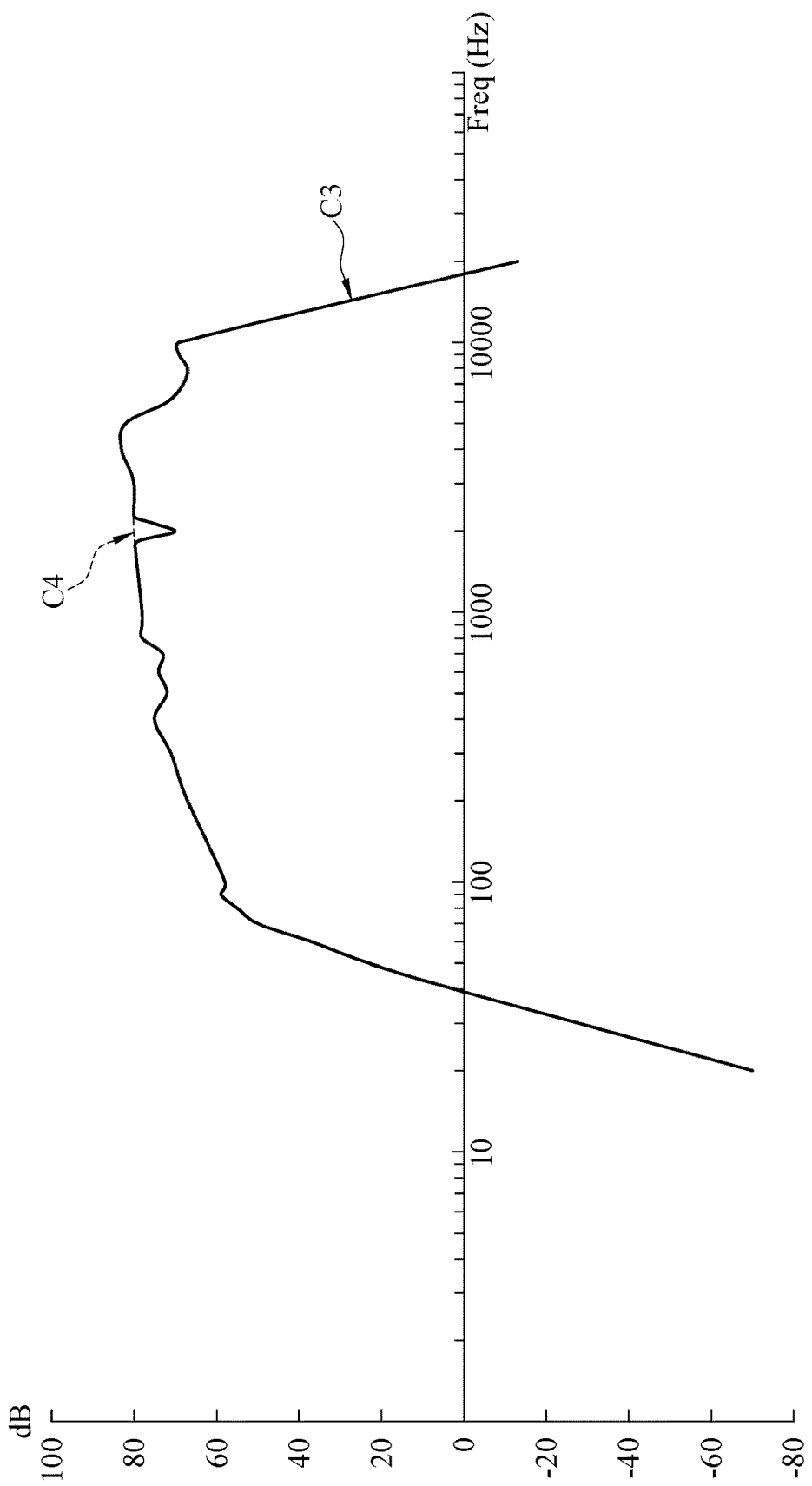
FIG. 5B is a comparison between the set of real first user parameters and the set of ideal first user parameters based on FIG. 5A.

Please refer to FIG. 5A and FIG. 5B, wherein FIG. 5A is a comparison between the real hearing sensitivity of user and the ideal hearing sensitivity, and FIG. 5B is a comparison between the set of real first user parameters and the set of ideal first user parameters based on FIG. 5A. As shown in FIG. 5A, the curve C1 is the spectrum of the hearing sensitivity of the right ear 2100 of the user 2000 while the curve C2 is the spectrum of the ideal hearing sensitivity. As shown in FIG. 5B, the curve C3 is related to the set of first user parameters corresponding to the curve C1 in FIG. 5A while the curve C4 is related to the set of ideal first user parameters.

In this embodiment, it is assumed that the first channel output device is ideal. As shown in FIG. 5A, the right ear 2100 of the user 2000 is less sensitive to sound with frequency around 2 kHz compared with the ideal hearing sensitivity. Hence, as shown in FIG. 5B, the sensitivity of the curve C3 is lower than the sensitivity of the curve C4 around 2 kHz. The set of first user parameters SPLU1 measured by the controller 1500 in the test mode is, for example, shown in table III.

TABLE III

| | | | Frequency (Hz) | | | | |
|---|---|---|---|---|---|---|---|
| | 500 | 1000 | 1500 | 2000 | 2500 | 3000 | ... |
| Δ SPL (dB) | ... | 0 | 0 | 0 | −10 | 0 | 0 | ... |

Here, ΔSPL represents the difference between ideal condition and the real condition when the first channel audio signal is output by the first channel output device 1100, passing through the cavity formed by the auditory meatus and the first channel output device 1100 as it is worn by the user 2000, and received by the ear 2100 of the user 2000. Hence, the controller 1500 adjusts the set of first parameters of frequency response as shown in Table IV.

TABLE IV

| | Frequency(Hz) | | |
|---|---|---|---|
| | 1500 | 2000 | 2500 |
| Gain | 0 | 10 | 0 |

Figure 6A:
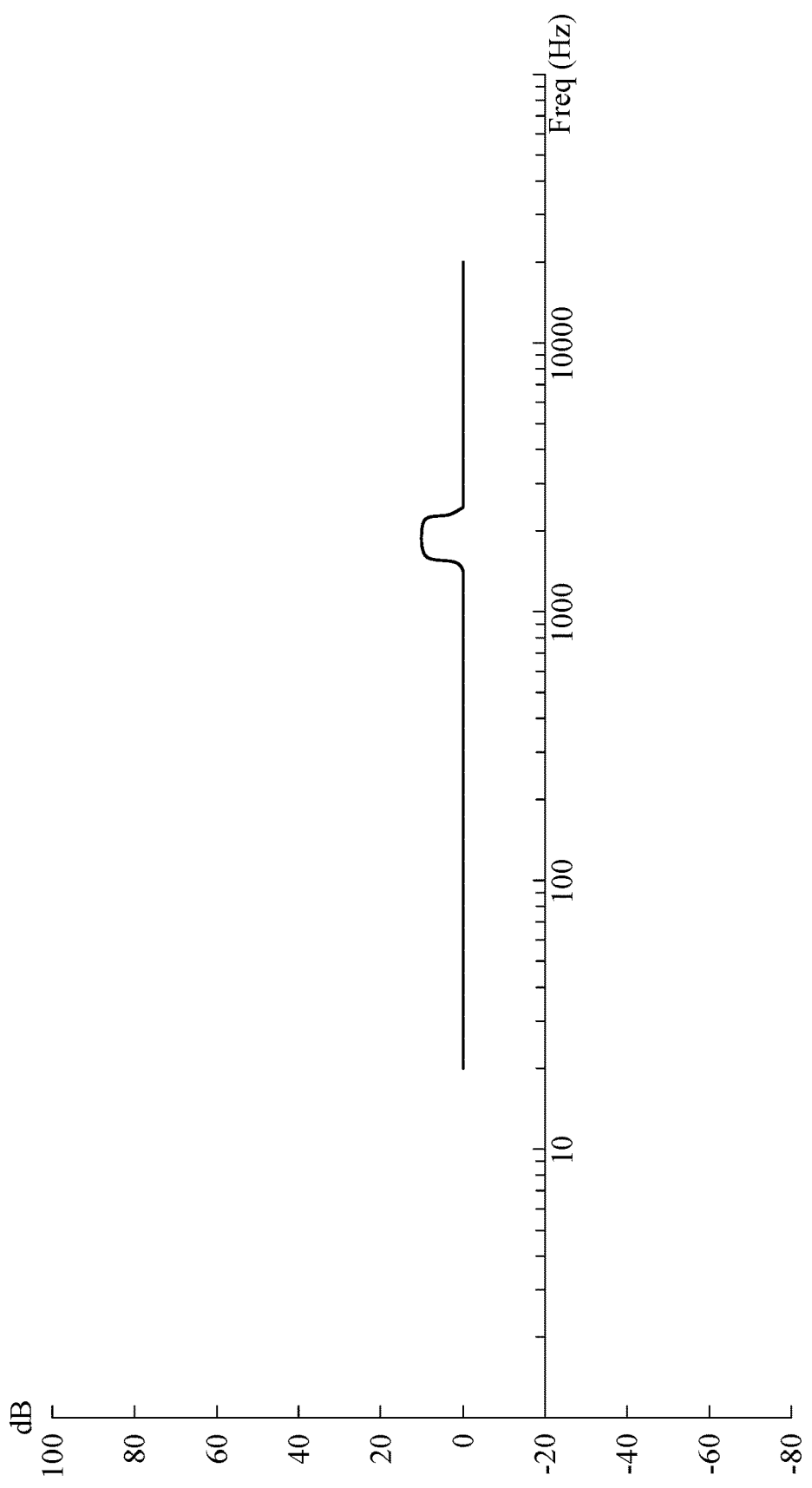
FIG. 6A illustrates a spectrum of the first frequency response of the first equalizer.
Figure 6B:
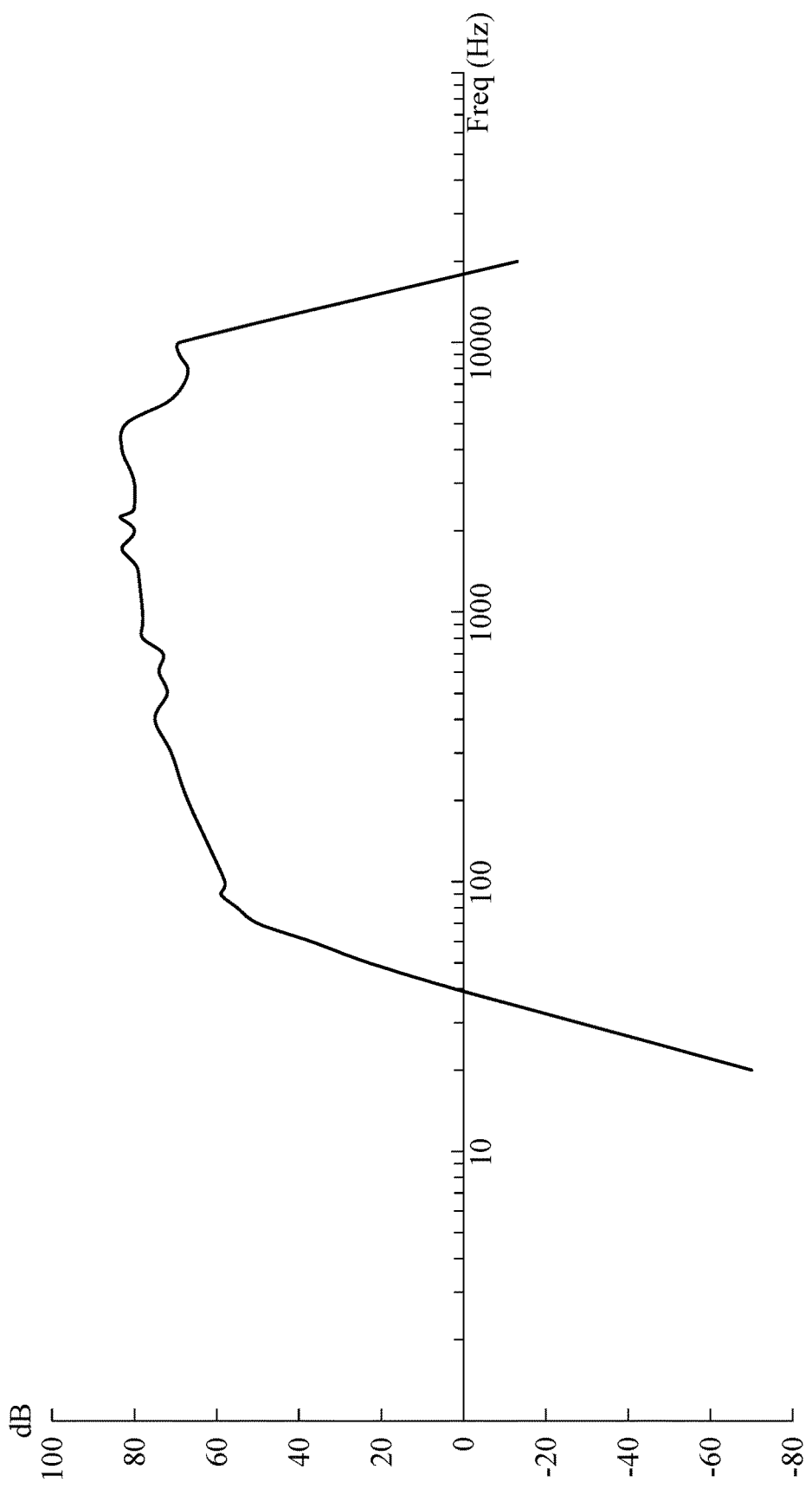
FIG. 6B illustrates a spectrum of the sound pressure level compensated by the equalizer.

Hence, the spectrum of the first frequency response of the first equalizer 1300 is shown in FIG. 6A and the spectrum of sound pressure level heard by the user is shown in FIG. 6B. It can be seen that the sound adjusted by the first equalizer 1300 and heard by the user 2000 is approximately equal to the sound heard by the user ideally, as shown in FIG. 4C.

Figure 7A:
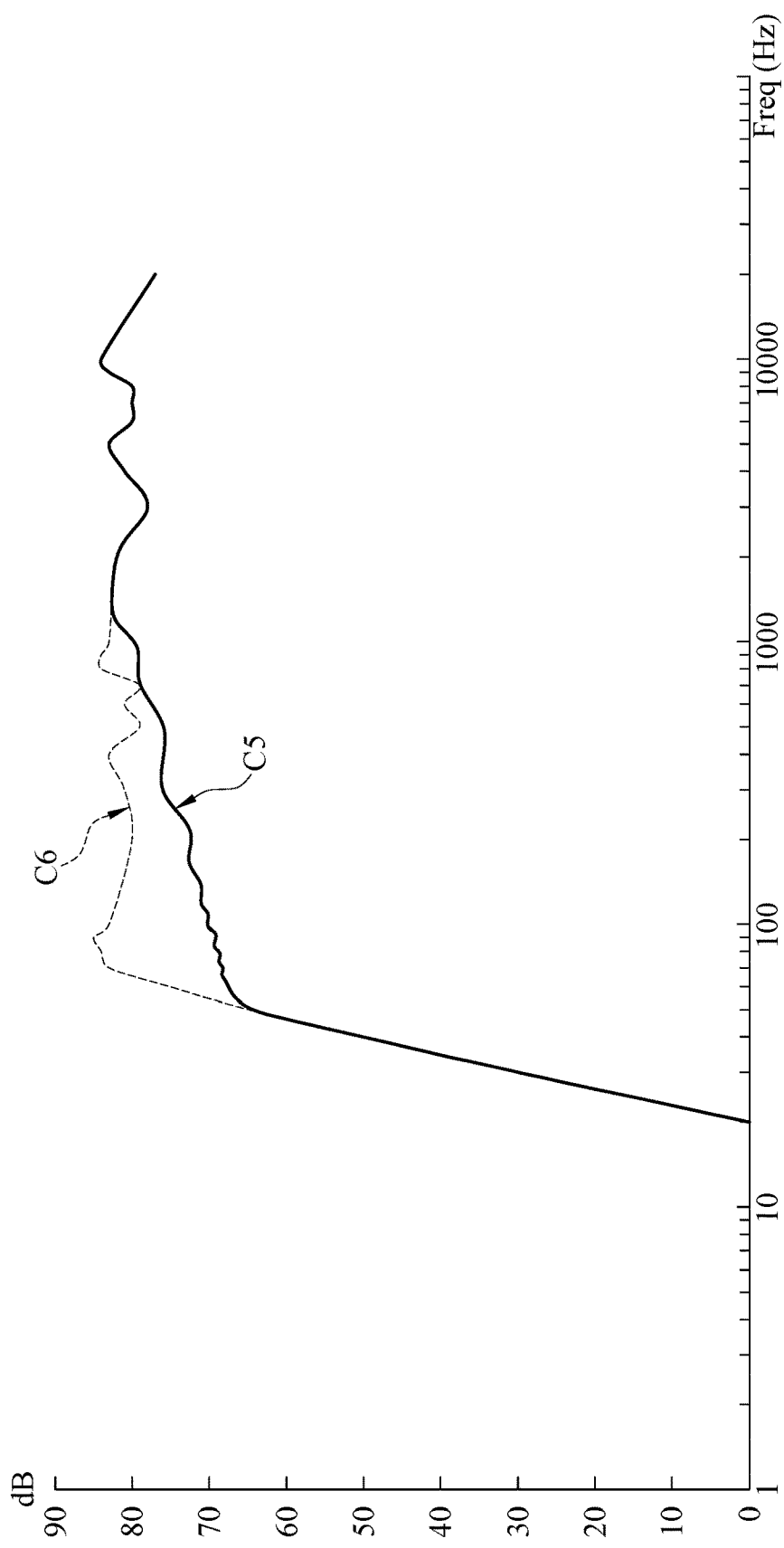
FIG. 7A illustrates a comparison between the real first sound pressure level response of the first channel output device and the theoretical sound pressure level response of the first channel output device.
Figure 7B:
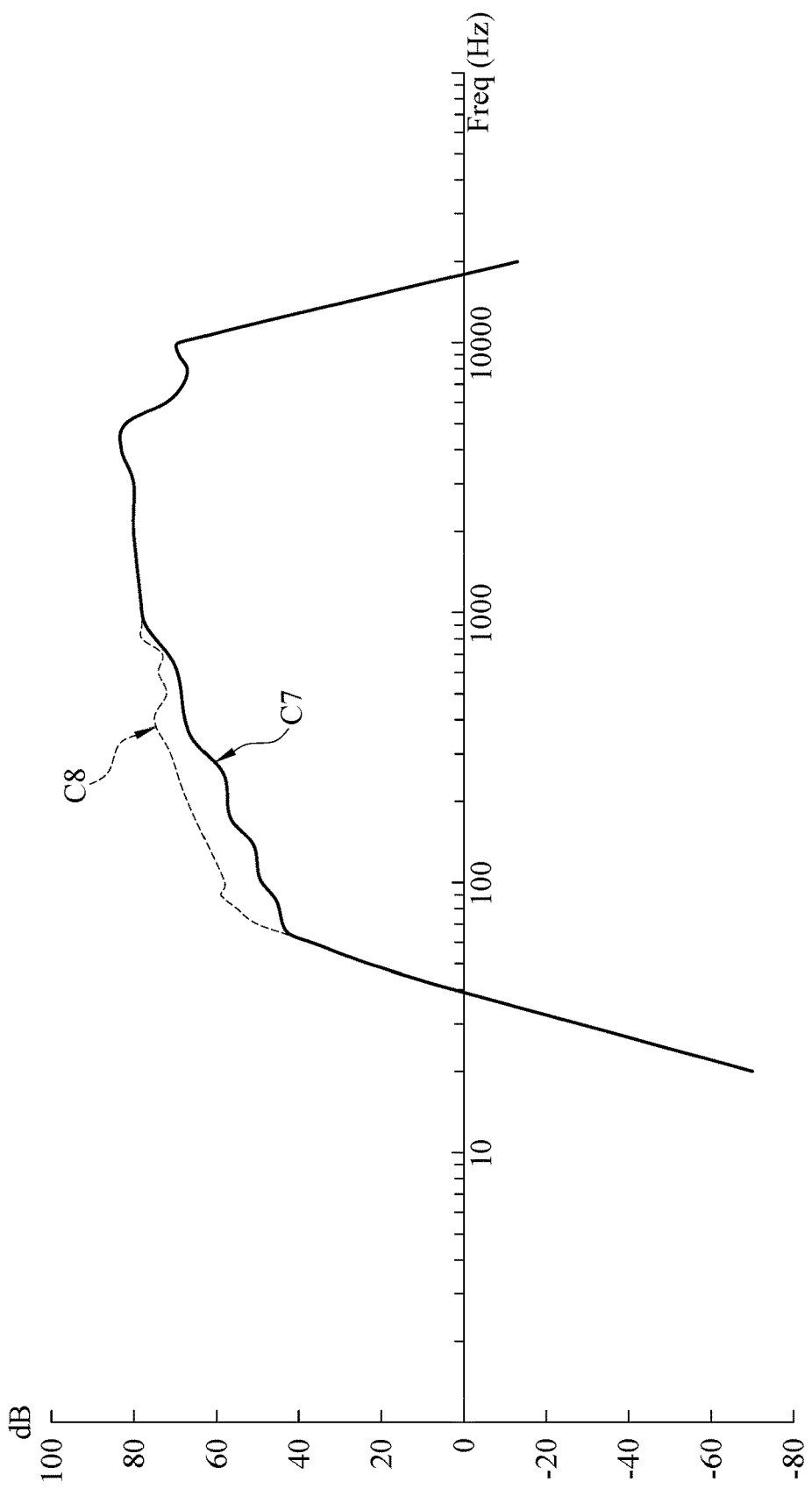
FIG. 7B illustrates a comparison between the set of real first user parameters and the set of ideal first user parameters corresponding to FIG. 7A.

Please refer to FIG. 7A and FIG. 7B, wherein FIG. 7A illustrates a comparison between the real first sound pressure level response of the first channel output device and the theoretical sound pressure level response of the first channel output device, and FIG. 7B illustrates a comparison between the set of real first user parameters and the set of ideal first user parameters corresponding to FIG. 7A. As shown in FIG. 7A, the curve C5 is the real first sound pressure level response of the first channel output device 1100 while the curve C6 is the first sound pressure level response of the first channel output device 1100 provided by the manufacturer. As shown in FIG. 7B, the curve C7 is related to the set of real first user parameters corresponding to the curve C5 while the curve C8 is related to the set of ideal first user parameters.

In this embodiment, assuming that the hearing sensitivity of the right ear 2100 of the user 2000 is ideal. As shown in FIG. 7A, the first channel output device 1100 has less loudness than its ideal characteristic for sound with frequency less than 1 kHz. Hence, as shown in FIG. 7B, the curve C7 is lower than the curve C8 for frequency less than 1 kHz. The set of first user parameters SPLU1 measured by the controller 1500 in the test mode is as shown in table V.

TABLE V

| | Frequency (Hz) | | | | | | | |
|---|---|---|---|---|---|---|---|---|
| | 500 | 1000 | 1500 | 2000 | 2500 | 3000 | 3500 | ... |
| Δ SPL (dB) | −5 | −1 | 0 | 0 | 0 | 0 | 0 | ... |

Here, ΔSPL represents the difference between ideal condition and the real condition when the first channel audio signal is output by the first channel output device 1100, passing through the cavity formed by the auditory meatus and the first channel output device 1100 as it is worn by the user 2000, and received by the ear 2100 of the user 2000. Hence, the controller 1500 adjusts the set of first parameters of frequency response as shown in Table VI.

TABLE VI

| | Frequency(Hz) | | |
|---|---|---|---|
| | 500 | 1000 | 1500 |
| Gain | +5 | +1 | 0 |

Figure 8A:
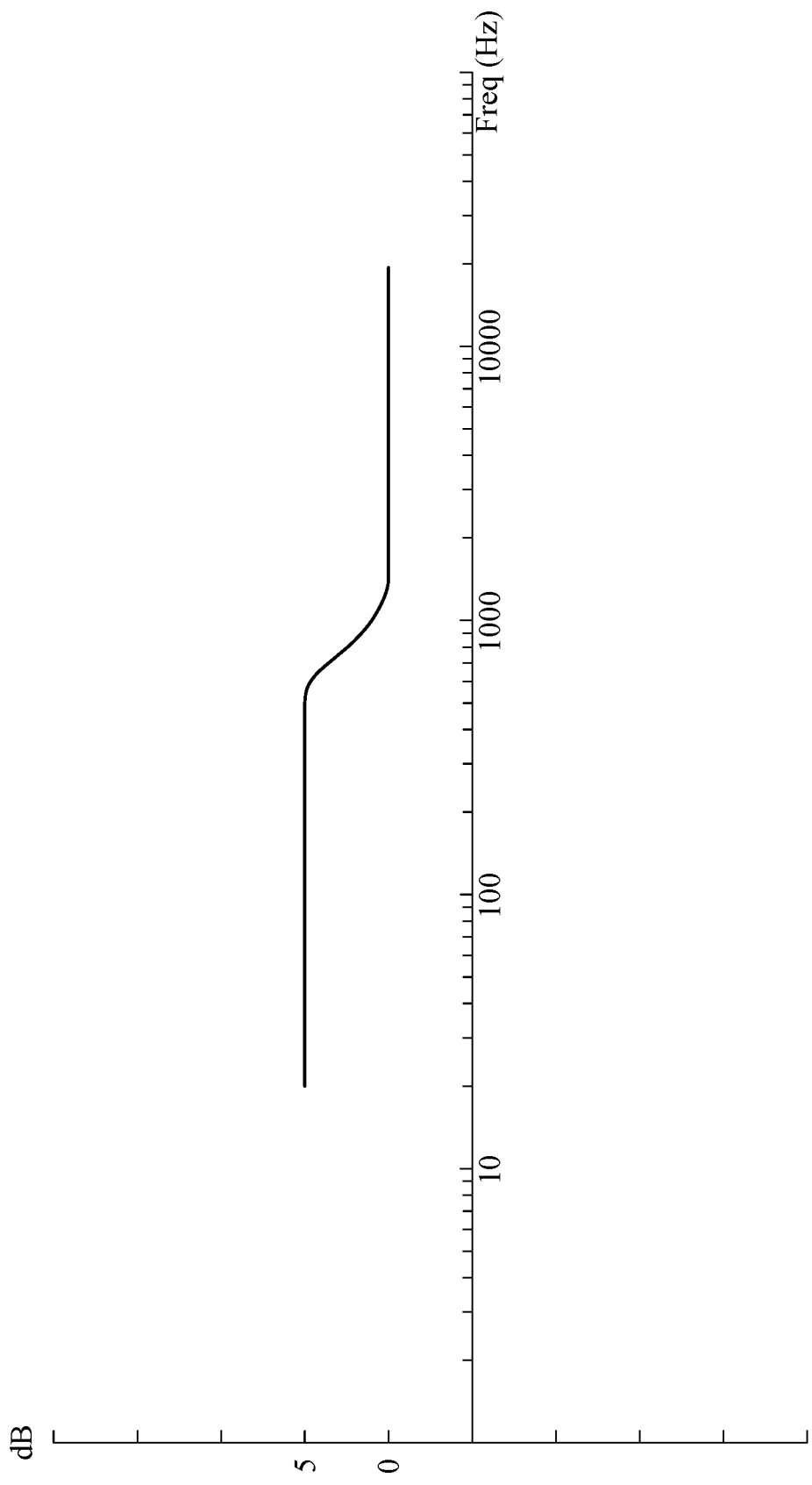
FIG. 8A illustrates a spectrum of the first frequency response of the first equalizer.
Figure 8B:
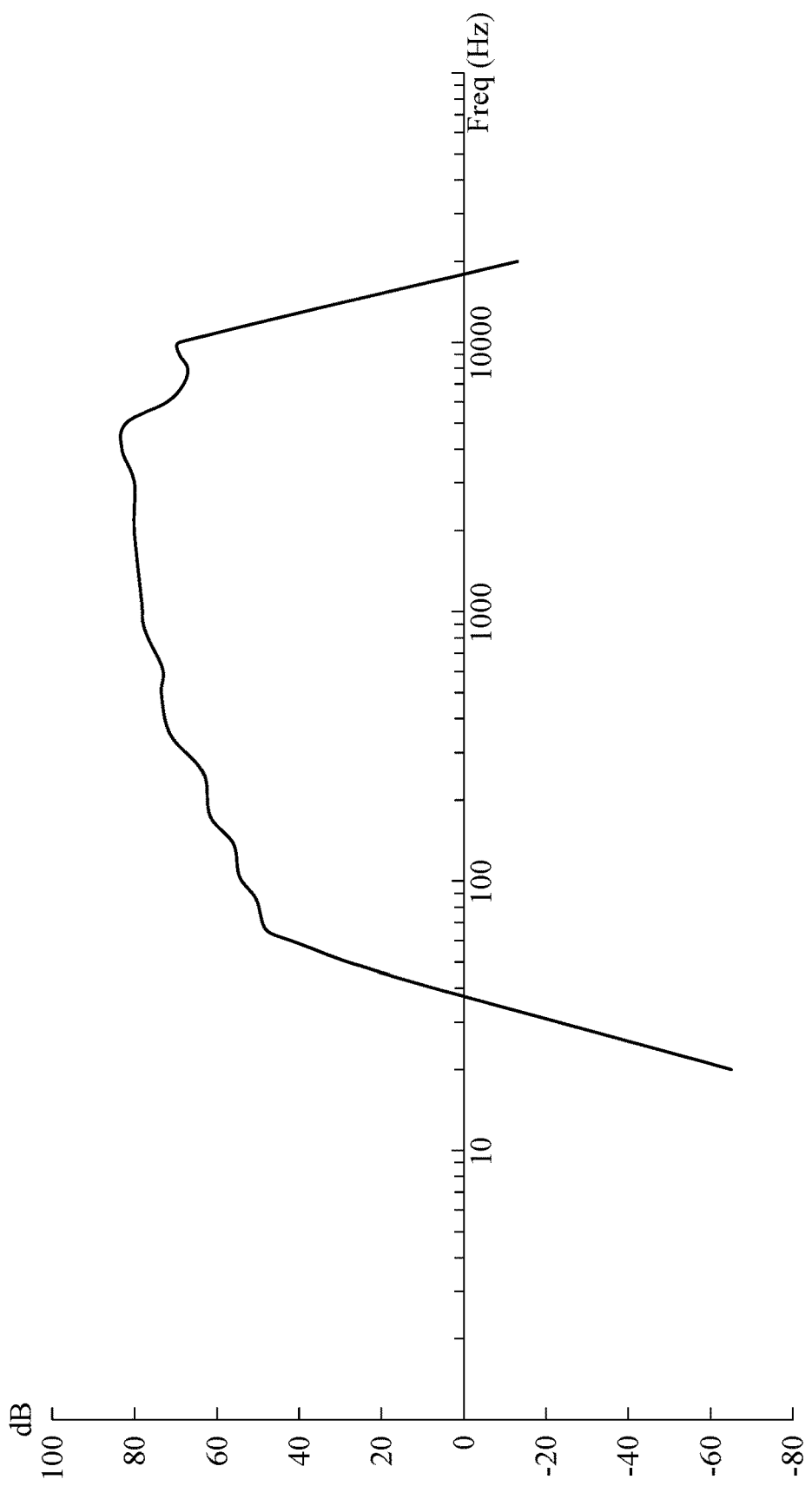
FIG. 8B illustrates a spectrum of the sound pressure level compensated by the equalizer.

Hence, the spectrum of the first frequency response of the first equalizer 1300 is shown in FIG. 8A and the spectrum of sound pressure level heard by the user is shown in FIG. 8B. It can be seen that the sound adjusted by the first equalizer 1300 and heard by the user 2000 is approximately equal to the sound heard by the user ideally, as shown in FIG. 4C.

In the aforementioned embodiments, the compensation is achieved by adjusting the loudness at certain frequencies at which the ear or the first channel output device of the audio playing system is less sensitive. However, in another embodiment, the loudness at the frequencies adjacent to the flaw frequency is increased so as to let the user experience the normal hearing. For example, if it is determined that there is flaw at 2 kHz based on the set of first user parameters SPLU1, the controller 1500 adjusts the set of first parameters of frequency response so as to increase the loudness at 1.8 kHz and 2.2 kHz and keep the loudness at 2 kHz unchanged.

Figure 9A:
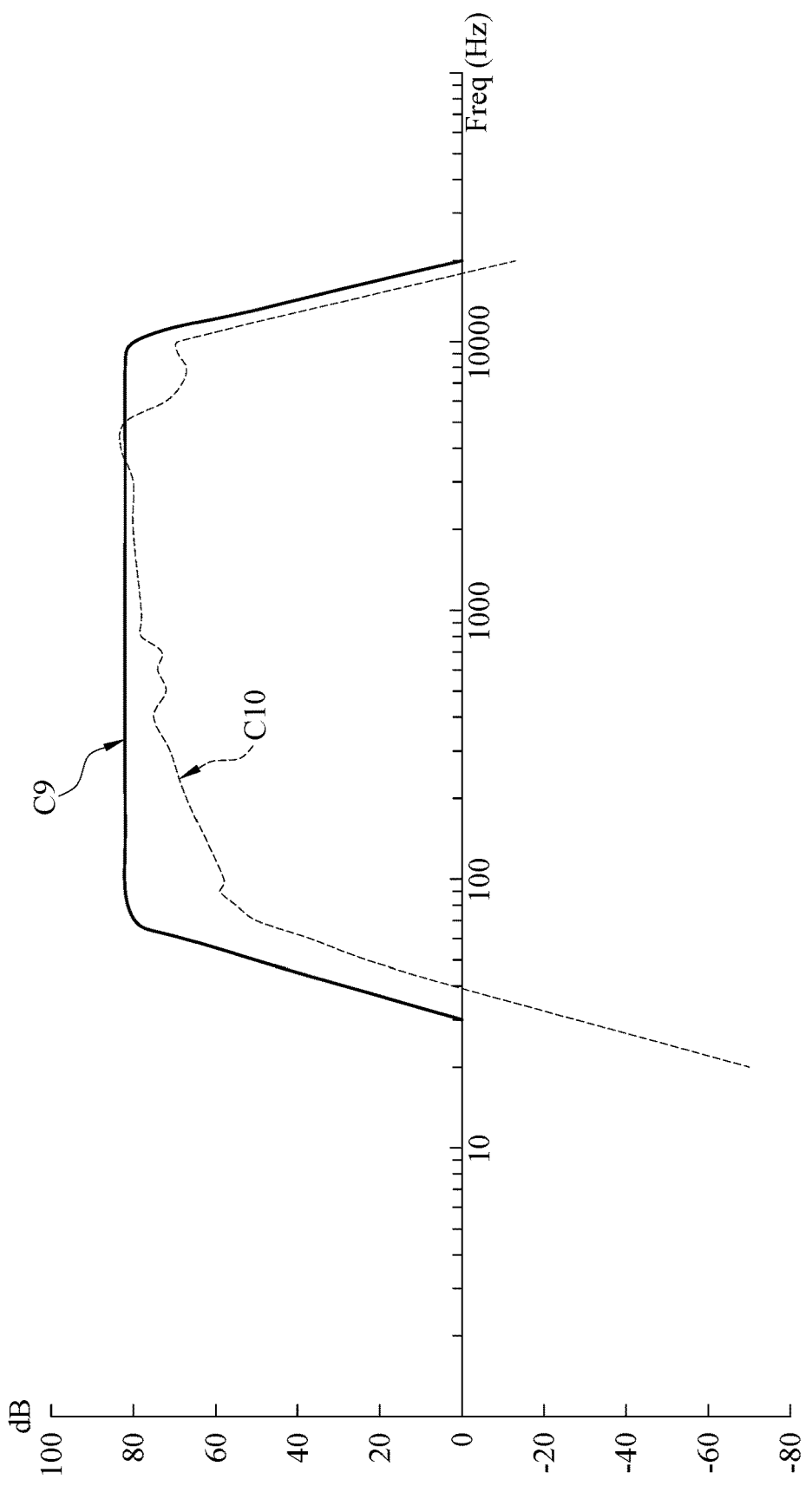
FIG. 9A illustrates the spectrum of the first user parameters and spectrum of the reference parameters of frequency response.
Figure 9B:
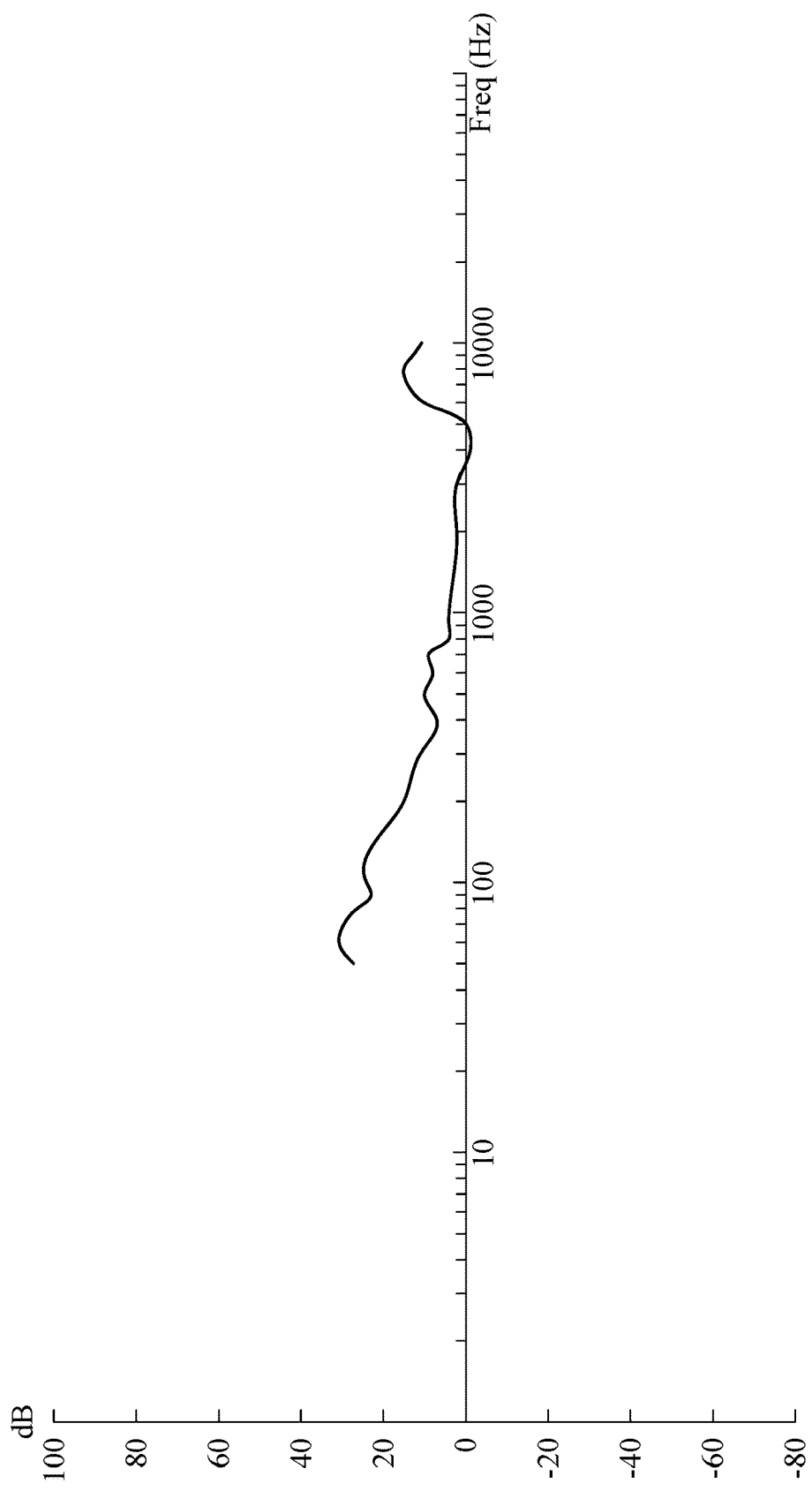
FIG. 9B illustrates a spectrum of the first parameters of frequency response obtained based on the two spectrums in FIG. 9A.

In one embodiment, please refer to FIG. 9A and FIG. 9B, wherein FIG. 9A illustrates the spectrum of the first user parameters and spectrum of the reference parameters of frequency response, and FIG. 9B illustrates a spectrum of the first parameters of frequency response obtained based on the two spectrums in FIG. 9A. In FIG. 9A, the curve C9 is, for example, a spectrum related to ideal hearing and the curve C10 is a spectrum related to the set of first user parameters SPLU1 obtained in the aforementioned test mode. The controller 1500 generates a spectrum as shown in FIG. 9B based on the curve C10 and the curve C9, also called as the reference parameters of frequency response, and adjusts the set of first parameters of frequency response based on the spectrum shown in FIG. 9B. Hence, when the first channel audio signal adjusted by the first equalizer 1300 is played by the first channel output device 1100, what is felt by the user 2000 is like the original first channel audio signal played by an ideal loudspeaker or an ideal earphone. The set of reference parameters of frequency response in this embodiment is, for example, the sound pressure level parameters of an expensive loudspeaker/earphone and is provided by the manufacturer (of the audio playing system 1000 or the expensive loudspeaker).

In another embodiment, however, the reference parameters of frequency response may be defined based on the equalizer parameters of frequency response set by the user 2000 when he uses the audio playing system. For example, the equalizer parameters of frequency response set by the user 2000 when he listens to rock music may be recorded by the controller 1500 as the first reference parameters of frequency response. The equalizer parameters of frequency response set by the user 2000 when he listens to classical music may be recorded by the controller 1500 as the second reference parameters of frequency response. In other words, the controller 1500 or a storage medium electrically connected to the controller 1500 may keep a plurality of sets of reference parameters of frequency response. These sets of reference parameters of frequency response may be related to the settings of a certain user in a variety of conditions such as circumstances, moods, or types of music. Otherwise, these sets of reference parameters of frequency response may be related to many users. Hence, when a user uses the audio playing system, he/she may quickly select a desired set of reference parameters of frequency response.

Figure 10:
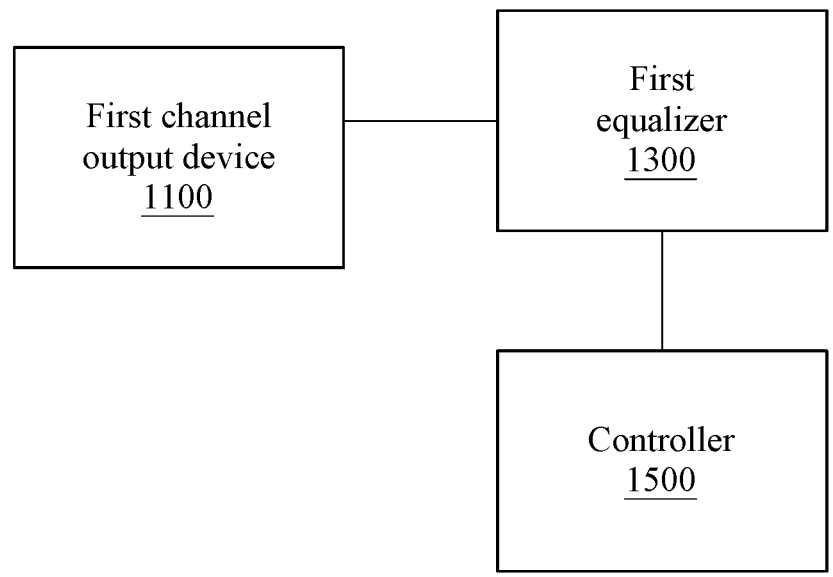
FIG. 10 is a schematic diagram of an audio playing system according to one embodiment of the present disclosure.

In the aforementioned embodiment, just as the architecture in FIG. 1, the controller 1500 is directly electrically connected to the first channel output device 1100 and the controller 1500 directly sends the test audio signal to the first channel output device 1100 for performing the test. In another embodiment, please refer to FIG. 10, the controller 1500 of the audio playing system 1000A is not directly electrically connected to the first channel output device 1100 but electrically coupled to the first channel output device 1100 via the first equalizer 1300. In this embodiment, the controller 1500 first reset the set of first parameters of frequency response of the first equalizer 1300 and then sends the test audio signals to the first channel output device 1100 via the first equalizer 1300.

Figure 11A:
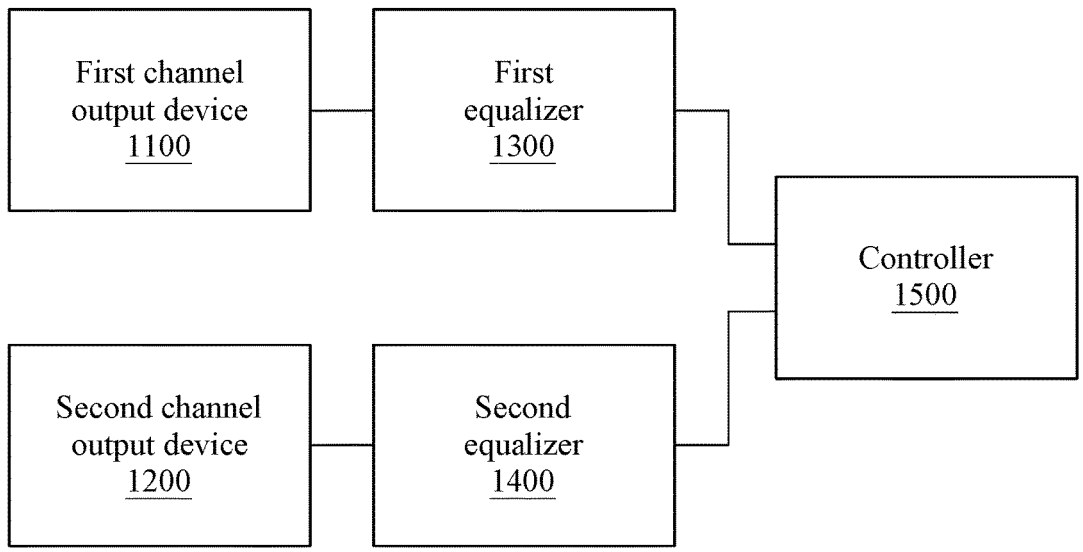
FIG. 11A illustrates a schematic block diagram of an audio playing system according to one embodiment of the present disclosure.

In one embodiment, please refer to FIG. 11A, which illustrates a schematic block diagram of an audio playing system according to one embodiment of the present disclosure. As shown in FIG. 11A, the audio playing system 1000B, compared with the audio playing system 1000 in FIG. 1, further has a second channel output device 1200 and a second equalizer 1400. In this embodiment, the relationship between the second equalizer 1400, the second channel output device 1200 and the controller 1500 is just the same as the relationship between the first equalizer 1300, the first channel output device 1100 and the controller 1500. In this embodiment, the controller 1500 respectively performs the test for the first channel output device 1100 and the second channel output device 1200 in the test mode so as to obtain a set of first user parameters and a set of second user parameters. The controller 1500 adjusts the set of first parameters of frequency response of the first equalizer 1300 based on the set of first user parameters and adjusts the set of second parameters of frequency response of the second equalizer 1400 based on the set of second user parameters. In other words, the set of adjusted first parameters of frequency response and the set of adjusted second parameters of frequency response may be different so as to compensate the difference between both channel output devices and both ears (of the user 2000). Hence, the audio playing system 1000B, being adjusted and compensated, provides better audio effect to the user 2000 in balance while compared with the conventional loudspeaker or earphone.

Figure 11B:
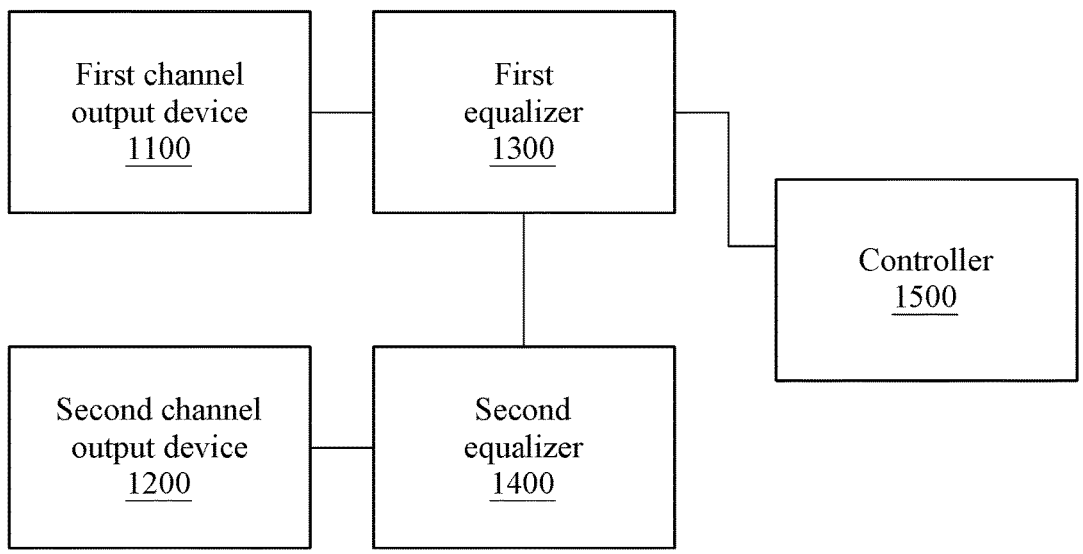
FIG. 11B illustrates a schematic diagram of an audio playing system according to one embodiment of the present disclosure.

In another embodiment, please refer to FIG. 11B, which illustrates a schematic diagram of an audio playing system according to one embodiment of the present disclosure. The audio playing system 1000C in FIG. 11B, compared with the audio playing system 1000B in FIG. 11A, has at least one difference that the controller 1500 is not directly electrically connected to the second equalizer 1400. Specifically, the controller 1500 is electrically coupled to the second equalizer 1400 via the first equalizer 1300, and the controller 1500 adjusts the set of second parameters of frequency response based on the set of second user parameters and the set of adjusted first parameters of frequency response. For example, if a 6 dB gain is needed at 1 kHz based on the set of second user parameters and the set of adjusted first parameters of frequency response provides a 2 dB gain at 1 kHz, the set of second parameters of frequency response is adjusted to provide a 4 dB gain at 1 kHz. Hence, the second channel audio signal is amplified with 6 dB gain at 1 kHz to meet the need of compensation after compensated by the first equalizer 1300 and the second equalizer 1400.

Figure 12:
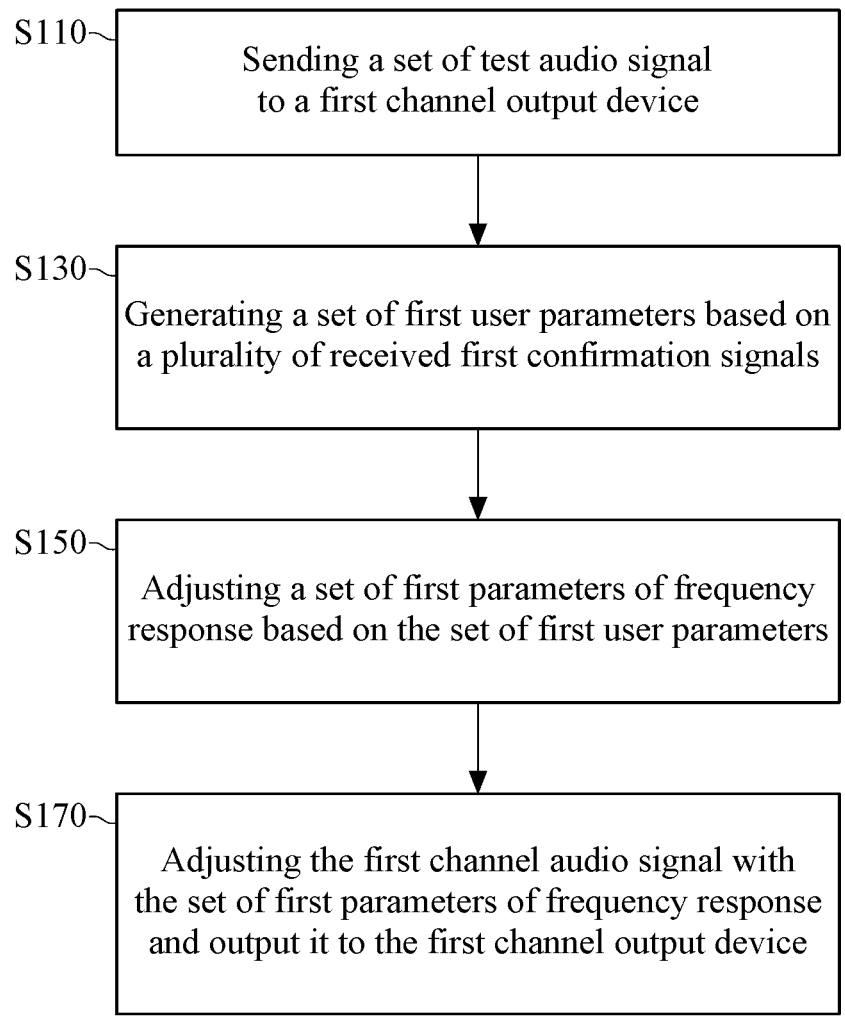
FIG. 12 is a method for controlling the audio playing system according to one embodiment of the present disclosure.

As above, the method for controlling the audio playing system may be concluded as below. Please refer to FIG. 12, which is a method for controlling the audio playing system according to one embodiment of the present disclosure. As shown in step S110, the controller sends a set of test audio signals to the first channel output device. As shown in step S130, the controller generates a set of first user parameters based on a plurality of piece of first confirmation signal received. As shown in step S150, the controller adjusts a set of first parameters of frequency response based on the set of first user parameters. As shown in step S170, the first equalizer adjusts the received first channel audio signal with the set of first parameters of frequency response and outputs the adjusted first channel audio signal to the first channel output device. The method may be implemented with either the aforementioned hardware or software application program.

Figure 13A:
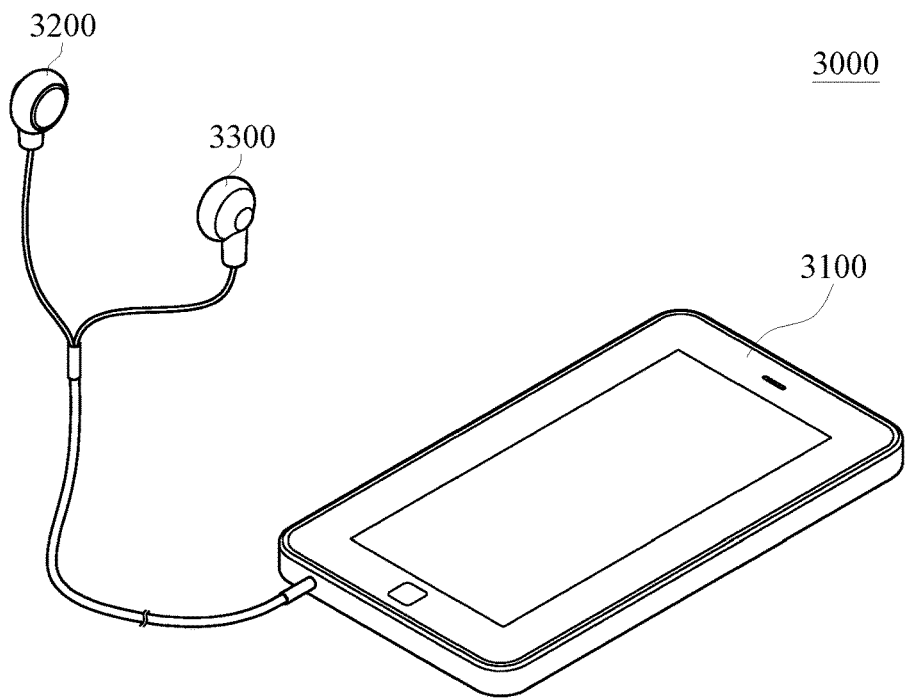
FIG. 13A is an appearance of an audio playing system according to one embodiment of the present disclosure.
Figure 13B:
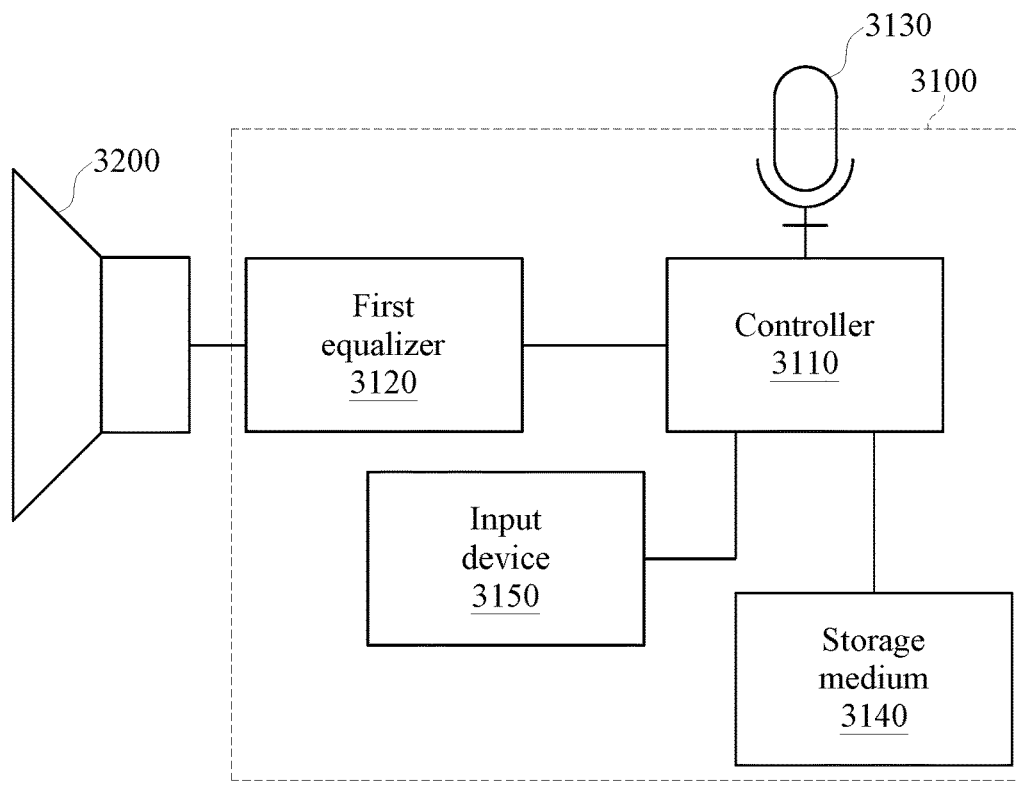
FIG. 13B is a functional block diagram corresponding to FIG. 13A.

In one embodiment, the audio playing system may be implemented as a portable electronic device. Please refer to FIG. 13A and FIG. 13B, wherein FIG. 13A is a schematic diagram of the appearance of an audio playing system according to one embodiment of the present disclosure, and FIG. 13B is a functional diagram of the audio playing system in FIG. 13A. As shown in FIG. 13A, the audio playing system 3000 according to one embodiment of the present disclosure has portable electronic device 3100 and the first channel output device 3200 and the second channel output device 3300, hereinafter referred to as the earphone 3200 and 3300. The earphone 3200 is, for example, an earphone with wire or wireless such as Bluetooth earphone. The earphone 3200 is configured to output the audio signal sent from the portable electronic device 3100 to ears of the user. As shown in FIG. 13B, the portable electronic device 3100 has controller 3110, a first equalizer 3120, and a storage medium 3140. The function of earphone 3200 is the same as the first channel output device 1100 in FIG. 1.

In one embodiment of the present disclosure, the first equalizer 3120 is electrically coupled to the earphone 3200. The first equalizer 3120 has a set of first parameters of frequency response and a set of second parameters of frequency response. In a first mode, the first equalizer 3120 adjusts the received first channel audio signal with the set of first parameters of frequency response and outputs the adjusted first channel audio signal to the earphone 3200. In a second mode, the first equalizer 3120 adjusts the received first channel audio signal with the set of second parameters of frequency response and outputs the adjusted first channel audio signal to the earphone 3200. In one embodiment, the set of first parameters of frequency response is used by the first equalizer 3120 for compensating a first range of frequency of the first channel audio signal and the set of second parameters of frequency response is used by the first equalizer 3120 for compensating a second range of frequency of the first channel audio signal. The method of compensation is shown in the embodiments in FIG. 4A~FIG. 6B. The first range of frequency is, for example, ranging from 20 Hz to 20 kHz, and the second range of frequency is, for example, ranging from 1 kHz to 5 kHz.

The controller 3110 is electrically coupled to the earphone 3200 and the first equalizer 3120. In the test mode, the controller 3110 sends a set of test audio signals to the earphone. The controller 3110 generates a set of first user parameters based on a plurality of received first confirmation signals and adjusts the set of first parameters of frequency response and the set of second parameters of frequency response based on the set of first user parameters. The controller 3110, based on one or more selection signal, controls the first equalizer 3120 to operate in the first mode or in the second mode.

Specifically, in the first mode, the first equalizer 3120 compensates the first range of frequency, from 20 Hz to 20 kHz, of the first channel audio signal with the set of first parameters of frequency response so as to provide good hearing experience. In the second mode, the first equalizer 3120 compensates the second range of frequency, from 1 kHz to 5 kHz, of the first channel audio signal with the set of second parameters of frequency response. The range of frequency compensated in the second mode is the range of frequency by which the human brain identifies the audio information. In other words, the portable electronic device 3100 operating in the first mode together with the earphone 3200 provides good hearing experience for user to enjoy music and/or the sound effect, and the portable electronic device 3100 operating in the second mode together with the earphone 3200 acts as a hearing aid apparatus.

In one embodiment of the present disclosure, as shown in FIG. 13B, the portable electronic device 3100 further has an audio receiver 3130 (microphone). When the controller 3110 determines that the source of the first channel audio signal is the audio receiver 3130, the controller 3110 adjusts the selection signal to make the first equalizer 3120 operate in the second mode. Otherwise, the controller 3110 adjusts the selection signal to make the first equalizer 3120 operate in the first mode. In other words, when the user take the portable electronic device 3100 as a hear aid apparatus, the user uses the audio receiver 3130 of the portable electronic device 3100 to receive audio signal. When the first channel audio signal is from the audio receiver 3130, the controller 3110 switches to the second mode automatically.

In another embodiment of the present disclosure, as shown in FIG. 13B, the portable electronic device 3100 has a storage medium 3140 electrically coupled to the controller 3110. The storage medium 3140 at least records a category table of application programs. The category table of application programs classifies the application programs executed by the portable electronic device 3100 into two categories. When the controller 3110 determines that the source of the first channel audio signal is an application program in the first category, the controller 3110 adjusts the selection signal to make the first equalizer 3120 operate in the first mode. When the controller 3110 determines that the source of the first channel audio signal is an application program in the second category, the controller 3110 adjusts the selection signal to make the first equalizer 3120 operate in the second mode. For example, the application programs in the first category are, for example, audio-video playing software, gaming software, and when the first channel audio signal comes from the application programs in the first category, it means that the user pursues the enjoyment of audio and video, so the controller 3110 makes the first equalizer 3120 operate in the first mode. The application programs in the second category are, for example, voice communication software, call software, and hearing aid software, and when the first channel audio signal comes from the application programs in the second category, it means that the user needs clear voice information, so the controller 3110 makes the first equalizer 3120 operate in the second mode to act as an hearing aid apparatus. The storage medium 3140 is, for example, a volatile storage medium or a non-volatile storage medium.

In yet another embodiment of the present disclosure, as shown in FIG. 13B, the portable electronic device 3100 further has an input device 3150 electrically coupled to the controller 3110. The input device 3150 is configured to receive the instructions from user and the controller 3110 selectively adjusts the selection signal based on the instruction from user. The input device 3150 is, for example, a touch screen, a button, or other elements for user to give instructions to the controller 3110. For example, the user may use the voice communication software to receive audio-video files, and the user needs the enjoyment of audio and video, so the user may use the touch screen or the button to give the instruction from user to make the controller 3110 adjust the selection signal so that the first equalizer 3120 operates in the first mode instead of the second mode.

In still one embodiment, the instruction from user received by the input device 3150 is not only used for adjusting the selection signal, but for controlling the controller 3110 to adjust the base gain of the first equalizer 3120. Specifically, if the base gain of the first equalizer 3120 increases, the loudness felt by the user when the audio signal is output by the earphone 3200 increases. If the base gain of the first equalizer 3120 decreases, the loudness felt by the user when the audio signal is output by the earphone 3200 decreases. Accordingly, the tuning of the loudness in the audio playing system 3000 may be realized by the portable electronic device 3100, so the audio playing system 3000 is capable of providing similar hearing compensations for a variety of users.

In another embodiment, please refer back to FIG. 13A. As shown in a previous embodiment, the audio playing system 3000 has another earphone 3300 (second channel output device). For example, when the earphone 3200 is for left ear, the earphone 3300 is for right ear. Similarly, the portable electronic device 3100 has a second equalizer (not shown) embedded therein and electrically coupled to the controller 3110 and the earphone 3300, respectively. The mechanism of the earphone 3300 and the second equalizer is just as illustrated in the embodiment in FIG. 11A and FIG. 11B and similar to the mechanism of the earphone 3200 and the first equalizer 3120.

As above, the audio playing system according to one embodiment of the present disclosure adjusts the parameters of frequency response of the equalizer based on the measurement of the response of the user for the test audio signals played by the channel output device so as to compensate the sensitivity of user's hearing and/or the sound pressure level response of the channel output device.

What is claimed is:

1. An audio playing system, comprising:
a first channel output device;
a first equalizer electrically coupled to the first channel output device and having a set of first parameters of frequency response and a set of second parameters of frequency response, the first equalizer configured to adjust a received first channel audio signal with the set of first parameters of frequency response and output the adjusted first channel audio signal to the first channel output device in a first mode, and the first equalizer configured to adjust the received first channel audio signal with the set of second parameters of frequency response and output the adjusted first channel audio signal to the first channel output device in a second mode; and
a controller electrically coupled to the first channel output device and the first equalizer, wherein in a test mode, the controller is configured to send a set of test audio signals to the first channel output device, to generate a set of first user parameters based on a plurality of pieces of received first confirmation signal, and to adjust the set of first parameters of frequency response and the set of second parameters of frequency response based on the set of first user parameters, and to control the first equalizer to operate in the first mode or the second mode based on a selection signal.

2. The system in claim 1, wherein the set of test audio signals comprising a plurality of sets of narrow bandwidth audio signals, and the sets of narrow bandwidth audio signals are different from each other in band, and each set of narrow bandwidth audio signals has a plurality of pieces of narrow bandwidth test audio signals, and the pieces of narrow bandwidth test audio signals are different from each other in loudness.

3. The system in claim 2, wherein a difference between central frequencies of the sets of narrow bandwidth audio signals are at least 500 Hz.

4. The system in claim 2, wherein the controller classifies the sets of narrow bandwidth audio signal into a first category including a plurality of sets of narrow bandwidth audio signal in low-band, a second category including a plurality of sets of narrow bandwidth audio signal in mid-band, and a third category including a plurality of sets of narrow bandwidth audio signal in high-band, and in the test mode, the controller is configured to send at least one set of narrow bandwidth audio signal in the first category, in the second category, and in the third category in sequence.

5. The system in claim 1, wherein the controller is electrically coupled to the first channel output device via the first equalizer, and in the test mode, the controller resets the set of first parameters of frequency response and sends the set of test audio signals to the first equalizer.

6. The system in claim 1, wherein the controller is electrically coupled to the first channel output device without via the first equalizer, and in the test mode, the controller directly sends the set of test audio signals to the first channel output device.

7. The system in claim 1, wherein the controller adjusts the selection signal based on a source of the first channel audio signal.

8. The system in claim 7, wherein the controller adjusts the set of first parameters of frequency response so that the first equalizer compensate a first range of frequency of the first channel audio signal and adjusts the set of second parameters of frequency response so that the first equalizer compensate a second range of frequency of the first channel audio signal, and the second range of frequency is part of the first range of frequency.

9. The system in claim 7, wherein when the source of the first channel audio signal is an audio receiver, the selection signal makes the first equalizer operate in the second mode, and when the source of the first channel audio signal is not the audio receiver, the selection signal makes the first equalizer operate in the first mode.

10. The system in claim 7, further comprising a storage medium recording a category table of application programs, wherein the category table at least classifies application programs executed by the audio playing system into a first category and a second category, wherein the selection signal makes the equalizer operate in the first mode when the source of the first channel audio signal is an application program in the first category and makes the equalizer operate in the second mode when the source of the first channel audio signal is an application program in the second category.

11. The system in claim 1, further comprising an input device electrically coupled to the controller and configured to receive an instruction from user, wherein the controller further selectively adjusts the selection signal based on the instruction from user.

12. The system in claim 1, further comprising an input device electrically coupled to the controller and configured to receive an instruction from user, wherein the controller further adjusts a base gain of the first equalizer based on the instruction from user.

13. The system in claim 1, further comprising:
a second channel output device electrically coupled to the controller; and
a second equalizer electrically coupled to the second channel output device and the controller and having a set of third parameters of frequency response and a set of fourth parameters of frequency response, the second equalizer configured to adjust a received second channel audio signal with the set of third parameters of frequency response and output the adjusted second channel audio signal to the second channel output device in the first mode and to adjust the received second channel audio signal with the set of fourth parameters of frequency response and output the adjusted second channel audio signal to the second channel output device in the second mode;

wherein in the test mode, the controller is configured to send the set of test audio signal to the second channel output device, to generate a set of second user parameters based on a plurality of pieces of received second confirmation signals, and to adjust the set of second parameters of frequency response based on the set of second user parameters.

14. The system in claim 13, wherein the controller is electrically coupled to the second equalizer via the first equalizer, and the controller adjusts the set of third parameters of frequency response and the set of fourth parameters of frequency response based on the set of second user parameters, the set of first parameters of frequency response and the set of second parameters of frequency response.

15. The system in claim 1, wherein the controller adjusts the set of first parameters of frequency response further based on a set of reference parameters of frequency response.

* * * * *